(12) United States Patent  (10) Patent No.: US 8,012,812 B2
Okazaki  (45) Date of Patent: Sep. 6, 2011

(54) SEMICONDUCTOR DEVICE AND METHOD FOR MANUFACTURING THE SAME

(75) Inventor: Yutaka Okazaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 604 days.

(21) Appl. No.: 12/174,252

(22) Filed: Jul. 16, 2008

(65) Prior Publication Data

US 2009/0020761 A1 Jan. 22, 2009

(30) Foreign Application Priority Data

Jul. 17, 2007 (JP) .................................. 2007-185597

(51) Int. Cl.
 *H01L 21/336* (2006.01)
(52) U.S. Cl. ................. 438/149; 438/458; 257/E21.421
(58) Field of Classification Search .................... 257/66, 257/67, 250, 278, E21.421, E21.623, E21.637, 257/E21.455; 438/30, 149, 458
See application file for complete search history.

(56) References Cited

U.S. PATENT DOCUMENTS

| 5,644,147 | A | 7/1997 | Yamazaki et al. |
| 5,821,138 | A | 10/1998 | Yamazaki et al. |
| 6,462,723 | B1 | 10/2002 | Yamazaki et al. |
| 6,906,344 | B2 | 6/2005 | Yamazaki et al. |
| 6,952,023 | B2 | 10/2005 | Yamazaki et al. |
| 7,189,997 | B2 | 3/2007 | Tsunoda et al. |
| 7,307,317 | B2 | 12/2007 | Koyama |
| 2003/0032210 | A1* | 2/2003 | Takayama et al. ............... 438/30 |
| 2005/0056842 | A1 | 3/2005 | Nishi et al. |
| 2005/0059219 | A1* | 3/2005 | Tayanaka ...................... 438/458 |
| 2005/0287846 | A1 | 12/2005 | Dozen et al. |
| 2006/0103349 | A1 | 5/2006 | Yamamoto |
| 2006/0110863 | A1 | 5/2006 | Yamamoto et al. |
| 2006/0121694 | A1 | 6/2006 | Tamura |
| 2006/0281235 | A1 | 12/2006 | Tayanaka |

FOREIGN PATENT DOCUMENTS

JP 2005-079283 3/2005

* cited by examiner

*Primary Examiner* — Evan Pert
*Assistant Examiner* — Selim Ahmed
(74) *Attorney, Agent, or Firm* — Nixon Peabody LLP; Jeffrey L. Costellia

(57) ABSTRACT

A separation layer is formed over a substrate, an insulating film 107 is formed over the separation layer, a bottom gate insulating film 103 is formed over the insulating film 107, an amorphous semiconductor film is formed over the bottom gate insulating film 103, the amorphous semiconductor film is crystallized to form a crystalline semiconductor film over the bottom gate insulating film 103, a top gate insulating film 105 is formed over the crystalline semiconductor film, top gate electrodes 106a and 106b are formed over the top gate insulating film 105, the separation layer is separated from the insulating film 107, the insulating film 107 is processed to expose the bottom gate insulating film 103, and bottom gate electrodes 115a and 115b in contact with exposed the gate insulating film 103 are formed.

8 Claims, 15 Drawing Sheets

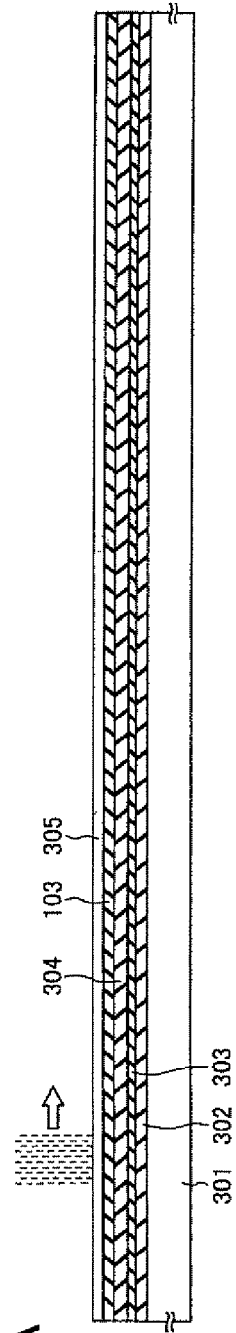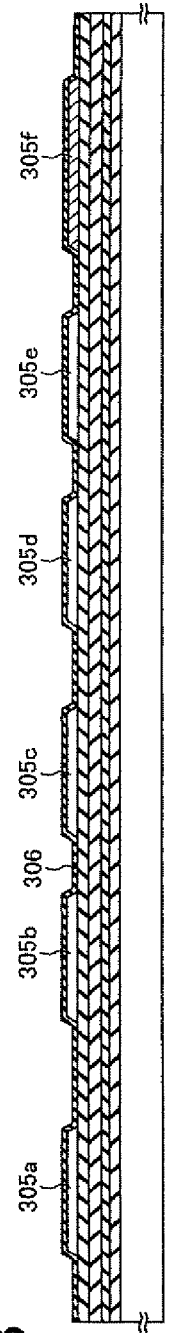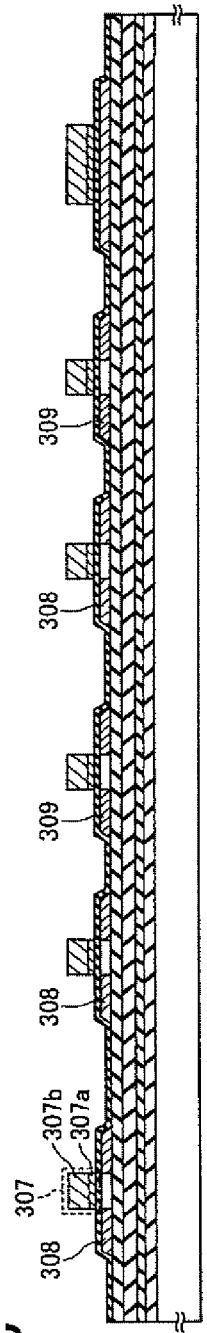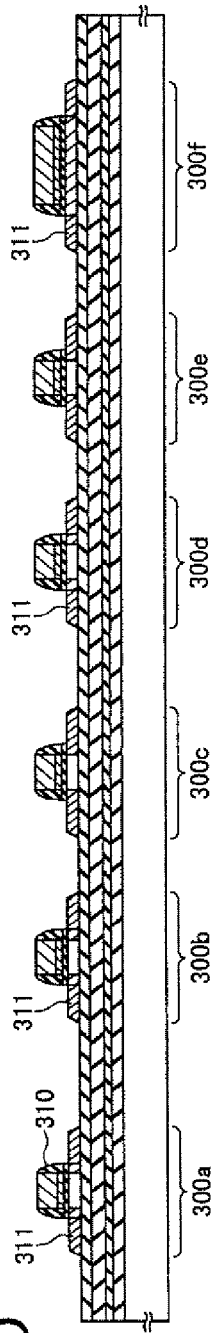

SEMICONDUCTOR DEVICE AND METHOD FOR MANUFACTURING THE SAME

BACKGROUND OF THE INVENTION

1. Field of the Invention

The present invention relates to a semiconductor device having a dual-gate thin film transistor and a method for manufacturing the semiconductor device. Specifically, the present invention relates to a semiconductor device in which a semiconductor film can be crystallized without being affected by a bottom gate electrode, and a method for manufacturing the semiconductor device.

2. Description of the Related Art

FIG. 14 is a cross-sectional view illustrating a conventional dual-gate thin film transistor (TFT). This dual-gate TFT includes a substrate body 10A, a bottom gate electrode 33, a bottom gate insulating film 34, a semiconductor film 35, a top gate insulating film 36 that is formed of first and second insulating layers 36a and 36b, a top gate electrode 37, and an interlayer insulating film 38. The semiconductor film 35 includes a channel region 35a, a source region 35x that is formed of a low concentration source region 35b and a high concentration source region 35d, and a drain region 35y that is formed of a low concentration drain region 35c and a high concentration drain region 35e. Contact holes 13 and 14 are provided in the top gate insulating film 36 and the interlayer insulating film 38. A source line 6a and a data line 6b are electrically connected to the high concentration source region 35d and the high concentration drain region 35e of the semiconductor film 35 through the contact holes 13 and 14, respectively.

A method for forming the semiconductor film 35 included in the dual-gate TFT is described with reference to FIGS. 15A and 15B. FIGS. 15A and 15B are cross-sectional views illustrating a method for forming the semiconductor film of the dual-gate TFT shown in FIG. 14.

As shown in FIG. 1A, the light-transmitting substrate body 10A that is formed of a glass substrate or the like and has a surface cleaned by ultrasonic cleaning or the like is prepared. Over the entire surface of the substrate body 10A, a conductive film 72 having a light-shielding property is formed to a thickness of greater than or equal to 10 nm and less than or equal to 500 nm using a metal, such as aluminum, tantalum, molybdenum, titanium, or chromium, an alloy containing any of the above metals as its main component, or the like by a sputtering method or the like. Then, the conductive film 72 is patterned by a photolithography method, whereby a bottom gate electrode 33 having a light-shielding property is formed over the substrate body 10A.

Subsequently, over the substrate body 10A including the bottom gate electrode 33, a bottom gate insulating film 34 is formed to a thickness of greater than or equal to 10 nm and less than or equal to 50 nm using silicon oxide ($SiO_2$), silicon nitride ($Si_3N_4$), or the like by a plasma CVD method or the like.

Subsequently, over the bottom gate insulating film 34, an amorphous semiconductor film 73 is formed to a thickness of greater than or equal to 10 nm and less than or equal to 100 nm using amorphous silicon (a-Si) by a plasma CVD method or the like, as shown in FIG. 15B. Subsequently, the amorphous semiconductor film 73 is heated by laser beam irradiation or the like to be polycrystallized, thereby forming a semiconductor film 24 formed of polycrystalline silicon. Subsequently, the polycrystalline semiconductor film 24 is patterned by a photolithography method, thereby forming the island-shaped semiconductor film 35 (e.g., see Patent Document 1 Japanese Published Patent Application No. 2005-79283, paragraphs 46 to 51, FIG. 5 and FIGS. 6A to 6E).

SUMMARY OF THE INVENTION

However, in the conventional dual-gate TFT, when the amorphous semiconductor film 73 is irradiated with a laser beam, it is possible that the bottom gate electrode 33 might absorb heat so that the amorphous semiconductor film 73 is not uniformly crystallized. An increase in thickness of the bottom gate insulating film 34 could be a method for avoiding such a problem. However, an increase in thickness of the gate insulating film 34 requires an increase in voltage to be applied to the bottom gate electrode 33 such that the dual-gate TFT can operate, resulting in an increase in power consumption.

In addition, in the above conventional dual-gate TFT, the amorphous semiconductor film 73 might have steps above opposite ends of the bottom gate electrode 33. When the amorphous semiconductor film 73 having such steps thus formed is heated or irradiated with a laser beam for crystallization, the volume of the melted amorphous semiconductor film might easily fluctuate. Further, there is a concern that the amorphous semiconductor film that is melted and liquefied may flow to sides of the bottom gate electrode as indicated by arrows and thus the shape of the polycrystalline semiconductor film 24 is uneven.

The present invention has been made in consideration of the above problems, and the object of the present invention is to provide a semiconductor device in which a semiconductor film can be crystallized without being affected by a bottom gate electrode and a method for manufacturing the semiconductor device.

In order to resolve the foregoing problems, one aspect of the present invention is a method for manufacturing a semiconductor device, which includes steps of forming a separation layer over a substrate, forming an insulating film over the separation layer, forming a bottom gate insulating film over the insulating film, forming an amorphous semiconductor film over the bottom gate insulating film, crystallizing the amorphous semiconductor film to form a crystalline semiconductor film over the bottom gate insulating film, forming a top gate insulating film over the crystalline semiconductor film, forming a top gate electrode over the top gate insulating film, separating the separation layer from the insulating film, processing the insulating film to expose the bottom gate insulating film, and forming a bottom gate electrode in contact with the exposed bottom gate insulating film.

According to the method for manufacturing a semiconductor device, the separation layer is formed over the substrate, the bottom gate insulating film is formed thereover, an amorphous semiconductor film is formed over the bottom gate insulating film and crystallized, the separation layer is separated from the insulating film, and the bottom gate electrode in contact with the bottom gate insulating film is formed. Accordingly, the amorphous semiconductor film can be crystallized without the bottom gate electrode being under the amorphous semiconductor film. Thus, the semiconductor film can be crystallized without being affected by the bottom gate electrode.

In addition, in the method for manufacturing a semiconductor device, according to the present invention, it is possible that the crystalline semiconductor film may include a channel formation region and that a region of contact between the bottom gate electrode and the bottom gate insulating film may be located within a region corresponding to the channel formation region. In addition, in the method for manufacturing a semiconductor device, according to the present invention, it is possible that the crystalline semiconductor film may include a channel formation region and low concentration impurity regions formed outward from the channel formation region and that a region of contact between the bottom gate electrode and the bottom gate insulating film may be located within a region corresponding to the channel formation region and the low concentration impurity regions.

Another aspect of the present invention is a method for manufacturing a semiconductor device, which includes steps of forming a separation layer over a substrate, forming an insulating film over the separation layer, forming an amorphous semiconductor film over the insulating film, crystallizing the amorphous semiconductor film to form a crystalline semiconductor film over the insulating film, forming a top gate insulating film over the crystalline semiconductor film, forming a top gate electrode over the top gate insulating film, separating the separation layer from the insulating film, forming an opening portion in the insulating film to expose the crystalline semiconductor film, forming a bottom gate insulating film in contact with the exposed crystalline semiconductor film, and forming a bottom gate electrode in contact with the bottom gate insulating film.

In addition, in the method for manufacturing a semiconductor device, according to the present invention, it is possible that the crystalline semiconductor film may include a channel formation region and that a region of the crystalline semiconductor film which is exposed by the opening portion may be located within a region corresponding to the channel formation region. In addition, in the method for manufacturing a semiconductor device, according to the present invention, it is possible that the crystalline semiconductor film may include a channel formation region and low concentration impurity regions formed outward from the channel formation region and that a region of the crystalline semiconductor film which is exposed by the opening portion may be located within a region corresponding to the channel formation region and the low concentration impurity regions.

Another aspect of the present invention is a method for manufacturing a semiconductor device, which includes steps of forming a separation layer over a substrate, forming an insulating film over the separation layer, forming an amorphous semiconductor film over the insulating film, crystallizing the amorphous semiconductor film to form a crystalline semiconductor film over the insulating film, forming a top gate insulating film over the crystalline semiconductor film, forming a top gate electrode over the top gate insulating film, separating the separation layer from the insulating film, processing the insulating film to expose the crystalline semiconductor film, processing the exposed crystalline semiconductor film to form a thin film region in which the crystalline semiconductor film is thinned in the crystalline semiconductor film, forming a bottom gate insulating film in contact with the thin film region, and forming a bottom gate electrode in contact with the bottom gate insulating film.

In addition, in the method for manufacturing a semiconductor device, according to the present invention, it is preferred that the crystalline semiconductor film include a channel formation region and that the thin film region be located within a region corresponding to the channel formation region.

Another aspect of the present invention is a semiconductor device including an insulating film, a bottom gate insulating film formed over the insulating film, a crystalline semiconductor film formed over the bottom gate insulating film by crystallizing an amorphous semiconductor film, a top gate insulating film formed over the crystalline semiconductor film, a top gate electrode formed over the top gate insulating film, an opening portion formed in the insulating film so as to be located under the bottom gate insulating film, and a bottom gate electrode formed in the opening portion so as to be in contact with the bottom gate insulating film.

In the above semiconductor device, the insulating film is desirably formed on a plane surface. The plane surface in this case refers to, for example, a surface of a glass substrate or the like. In such a semiconductor device, the insulating film is formed on the plane surface, the bottom gate insulating film is formed over the insulating film, and an amorphous semiconductor film formed over the bottom gate insulating film is crystallized. Thus, the amorphous semiconductor film can be made to have a shape formed on the plane surface, whereby the semiconductor film can be crystallized without being affected by the bottom gate electrode as in the cases of the conventional technologies. In addition, also in the case of a semiconductor device described below, the insulating film is preferably formed on a plane surface.

Another aspect of the present invention is a semiconductor device including an insulating film, a crystalline semiconductor film formed over the insulating film by crystallizing an amorphous semiconductor film, a top gate insulating film formed over the crystalline semiconductor film, a top gate electrode formed over the top gate insulating film, an opening portion formed in the insulating film and located under the crystalline semiconductor film, a bottom gate insulating film formed in the opening portion and in contact with the crystalline semiconductor film, and a bottom gate electrode formed in the opening portion and in contact with the bottom gate insulating film.

In addition, in the semiconductor device according to the present invention, it is possible that the crystalline semiconductor film may include a channel formation region and that a region of contact between the bottom gate electrode and the bottom gate insulating film may also be located within a region corresponding to the channel formation region. In addition, in the semiconductor device according to the present invention, it is possible that the crystalline semiconductor film may include a channel formation region and low concentration impurity regions formed outward from the channel formation region and that a region of contact between the bottom gate electrode and the bottom gate insulating film may also located within a region corresponding to the channel formation region and the low concentration impurity regions.

Another aspect of the present invention is a semiconductor device including an insulating film, a crystalline semiconductor film formed over the insulating film by crystallizing an amorphous semiconductor film, a top gate insulating film formed over the crystalline semiconductor film, a top gate electrode formed over the top gate insulating film, an opening portion formed in the insulating film and located under the crystalline semiconductor film, a depression portion connected to the opening portion and formed in the crystalline semiconductor film, a thin film region in which the crystalline semiconductor film is thinned, a bottom gate insulating film formed in the depression portion and in contact with the thin film region, and a bottom gate electrode formed in the depression portion and the opening portion and in contact with the bottom gate insulating film.

In addition, in the semiconductor device according to the present invention, it is preferred that the crystalline semiconductor film include a channel formation region and that the thin film region be located within a region corresponding to the channel formation region.

As described above, according to the present invention, a semiconductor device in which a semiconductor film can be

BRIEF DESCRIPTION OF THE DRAWINGS

FIGS. 10A to 10D show an example of a method for manufacturing a semiconductor device of the present invention.

DETAILED DESCRIPTION OF THE INVENTION

Figure 1A:
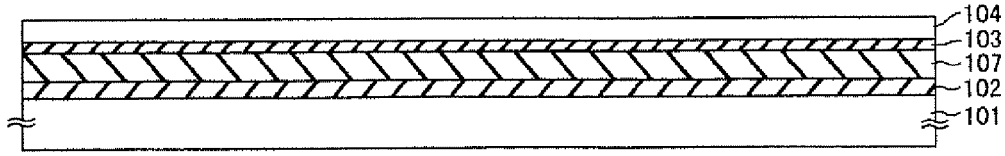
FIGS. 1A to 1E are cross-sectional views showing a method for manufacturing a semiconductor device, according to Embodiment Mode 1 of the present invention.
Figure 1B:
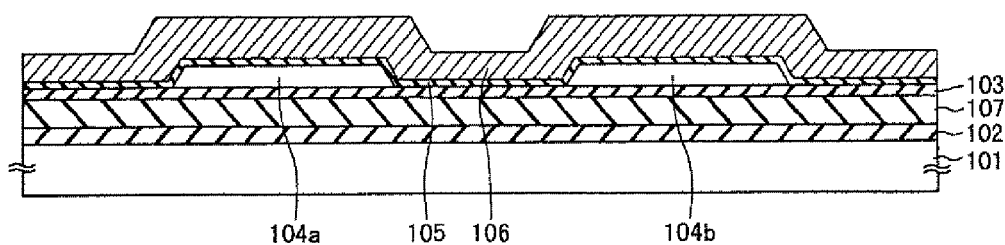

Hereinafter, embodiment modes of the present invention are described with reference to the accompanying drawings. It is to be noted that the present invention can be implemented in a variety of different modes, and it is easily understood by those skilled in the art that a variety of changes and modifications can be made without departing from the spirit and scope of the present invention. Therefore, the present invention should not be construed as being limited to the description of the embodiment modes. It is to be noted that portions that are the same or have similar functions are denoted by the same reference numerals in the drawings of this specification.

Embodiment Mode 1

FIGS. 1A to 1E, FIGS. 2A to 2C, and FIGS. 3A and 3B are cross-sectional views illustrating a method for manufacturing a semiconductor device, according to Embodiment Mode 1 of the present invention.

First, a separation layer 102, an insulating film 107, a bottom gate insulating film 103, and a semiconductor film 104 are stacked over a substrate 101 (see FIG. 1A). The separation layer 102, the insulating film 107, the bottom gate insulating film 103, and the semiconductor film 104 can be formed in succession. The successive formation does not cause exposure to air, and thus contamination of impurities can be prevented.

As the substrate 101, a glass substrate, a quartz substrate, a metal substrate, a stainless steel substrate, a heat-resistant plastic substrate that can withstand the process temperature of this step, or the like is preferably used. There is no particular limitation on the area or shape of such a substrate; thus, use of a rectangular substrate having one side of 1 meter or more, for example, can significantly improve the productivity.

It is to be noted that the separation layer 102 is provided over an entire surface of the substrate 101 in this step but may be selectively provided, as necessary, by being selectively etched after provision of a separation layer over the entire surface of the substrate 101. Further, the separation layer 102 is formed so as to be in contact with the substrate 101 but, as necessary, may be formed so as to be in contact with an insulating film, such as a silicon oxide ($SiO_x$) film, a silicon oxynitride ($SiO_xN_y$) (x>y) film, a silicon nitride ($SiN_x$) film, or a silicon nitride oxide ($SiN_xO_y$) (x>y) film, which is formed so as to be in contact with the substrate 101.

For the separation layer 102, a metal film, a layered structure of a metal film and a metal oxide film, or the like can be employed. The metal film is formed to have a single-layer or layered structure of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy or compound material containing any of the above elements as its main component. Such a material can be formed by a sputtering method, any of various CVD methods such as a plasma CVD method, or the like. The stack of a metal film and a metal oxide film can be formed as follows: the above metal film is formed, and then plasma treatment under an oxygen atmosphere or an $N_2O$ atmosphere or heat treatment under an oxygen atmosphere or an $N_2O$ atmosphere is performed, whereby an oxide or an oxynitride of the metal film can be provided on the surface of the metal film. Alternatively, the metal film is formed and then the surface of the metal film may be processed with a strong oxidative solution such as ozone water, whereby an oxide or an oxynitride of the metal film can be provided on the surface of the metal film.

The insulating film 107 is formed to have a single-layer or layered structure of a film containing an oxide of silicon or a nitride of silicon by a sputtering method, a plasma CVD method, or the like. In the case where the insulating film 107 has a two-layer structure, for example, a silicon nitride oxide film may be formed as a first layer and a silicon oxynitride film may be formed as a second layer. In the case where the insulating film 107 has a three-layer structure, a silicon oxide film, a silicon nitride oxide film, and a silicon oxynitride film may be formed as a first layer, a second layer, and a third layer, respectively. Alternatively, a silicon oxynitride film, a silicon nitride oxide film, and a silicon oxynitride film may be formed as a first layer, a second layer, and a third layer, respectively. The insulating film 107 functions as a blocking film which prevents entry of impurities from the substrate 101.

The semiconductor film 104 is formed to a thickness of greater than or equal to 25 nm and less than or equal to 200 nm (preferably, greater than or equal to 30 nm and less than or equal to 150 nm) by a sputtering method, an LPCVD method, a plasma CVD method, or the like. As the semiconductor film 104, an amorphous silicon film may be formed, for example.

Next, the amorphous semiconductor film 104 is crystallized by laser beam irradiation. The amorphous semiconductor film 104 may be crystallized by a method in which laser beam irradiation is combined with a thermal crystallization method using RTA or an annealing furnace or with a thermal crystallization method using a metal element that promotes the crystallization, or the like. Then, the obtained crystalline semiconductor film is etched to have a desired shape, thereby forming crystalline semiconductor films 104a and 104b. A top gate insulating film 105 is formed so as to cover the semiconductor films 104a and 104b, and then a conductive film 106 is formed (see FIG. 1B).

An example of the formation process of the crystalline semiconductor films 104a and 104b is briefly described below. First, the amorphous semiconductor film 104 (e.g., an amorphous silicon film) is formed to a thickness of greater than or equal to 50 nm and less than or equal to 60 nm by a plasma CVD method. Next, after a solution containing nickel, which is a metal element that promotes crystallization, is retained over the amorphous semiconductor film, the amorphous semiconductor film is subjected to dehydrogenation treatment (at 500° C. for one hour) and then thermal crystallization treatment (at 550° C. for four hours) to form a crystalline semiconductor film. After that, by irradiation with a laser beam from a laser and a photolithography method, the crystalline semiconductor films 104a and 104b are formed. It is to be noted that alternatively, the amorphous semiconductor film may be crystallized only by laser beam irradiation without conducting thermal crystallization using a metal element that promotes crystallization.

For the laser beam from the laser, a continuous wave laser beam (a CW laser beam) or a pulsed laser beam (a pulse laser beam) can be used. The laser beam that can be used in this case is emitted from one or more of a gas laser such as an Ar laser, a Kr laser, or an excimer laser; a laser of which the medium is single crystal YAG, YVO$_4$, forsterite (Mg$_2$SiO$_4$), YAlO$_3$, GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm and Ta is added as a dopant; a glass laser; a ruby laser; an alexandrite laser; a Ti:sapphire laser; a copper vapor laser; and a gold vapor laser. When irradiation is carried out with the fundamental wave of such a laser beam or the second to fourth harmonics of the fundamental wave, crystals with a large grain size can be obtained. For example, a second harmonic (532 nm) or a third harmonic (355 nm) of an Nd:YVO$_4$ laser (a fundamental wave of 1064 nm) can be used. In this case, a laser power density of about greater than or equal to 0.01 MW/cm$^2$ and less than or equal to 100 MW/cm$^2$ (preferably, greater than or equal to 0.1 MW/cm$^2$ and less than or equal to 10 MW/cm$^2$) is needed. The scanning rate is set to be about 10 cm/sec to 2000 cm/sec for the irradiation. It is to be noted that continuous oscillation can be performed with a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta is added as a dopant; an Ar ion laser; or a Ti:sapphire laser. Pulse oscillation thereof can also be performed at a repetition rate of 10 MHz or more by a Q-switch operation, mode locking, or the like. When pulsed oscillation is performed at a repetition rate of 10 MHz or more, the semiconductor film is irradiated with the next pulse after melting of the semiconductor film by laser beam and before solidification of the semiconductor film. Accordingly, unlike in the case of using a pulsed laser with a low repetition rate, since a solid-liquid interface can be continuously moved in the semiconductor film, crystal grains which have grown continuously in a scanning direction can be obtained.

As the conductive film 106, for example, a film containing an element selected from tantalum (Ta), tungsten (W), titanium (Ti), molybdenum (Mo), aluminum (Al), copper (Cu), chromium (Cr), niobium (Nb), and the like; a film containing a nitride of such an element (typically, a tantalum nitride film, a tungsten nitride film, or a titanium nitride film); an alloy film in which any of such elements are combined (typically a Mo—W alloy or a Mo—Ta alloy); or a silicide film of such an element (typically, a tungsten silicide film, a titanium silicide film, or a nickel silicide film) can be used. Alternatively, the conductive film 106 may have a structure in which a plurality of conductive films is stacked. For example, a tantalum nitride film with a thickness of greater than or equal to 20 nm and less than or equal to 100 nm and a tungsten film with a thickness of greater than or equal to 100 nm and less than or equal to 400 nm can be stacked in this order. Tungsten and tantalum nitride have high heat resistance, and thus can be subjected to heat treatment for the purpose of heat activation after formation of the conductive film.

Figure 1C:
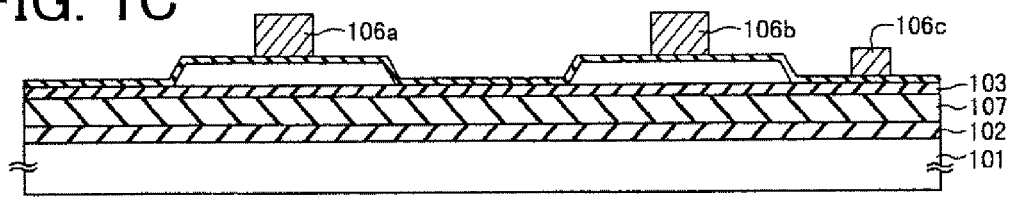

Next, the conductive film 106 is selectively etched, whereby a conductive film 106a and a conductive film 106b are made to remain over the semiconductor film 104a and the semiconductor film 104b, respectively, with the top gate insulating film 105 interposed therebetween, whereas a conductive film 106c is made to remain over the top gate insulating film 105 in the region where the semiconductor film is not formed (see FIG. 1C). Each of the conductive films 106a and 106b functions as a top gate electrode in a transistor to be completed later. In addition, the conductive film 106c can function as a wiring.

Figure 1D:
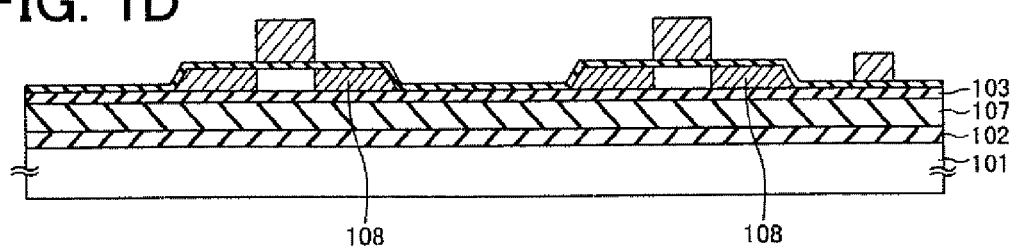
Figure 1E:
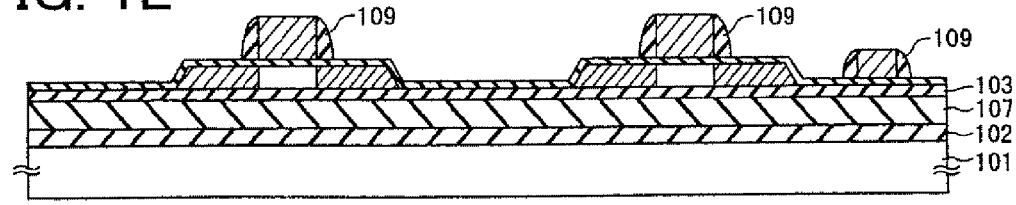

Next, an impurity element is introduced into the semiconductor films 104a and 104b with the use of the conductive films 106a and 106b as masks, whereby impurity regions 108 are formed in the semiconductor films 104a and 104b (see FIG. 1D).

An impurity element used for the doping is either an n-type impurity element or a p-type impurity element. As an n-type impurity element, phosphorus (P), arsenic (As), or the like can be used. As a p-type impurity element, boron (B), aluminum (Al), gallium (Ga), or the like can be used. In this case, the case where phosphorus (P) is introduced into the semiconductor films 104a and 104b to form the n-type impurity regions 108 is described.

Next, an insulating film is formed so as to cover the top gate insulating film 105 and the conductive films 106a, 106b, and 106c. The insulating film is formed to have a single-layer or layered structure of a film containing an inorganic material such as silicon, an oxide of silicon, or a nitride of silicon, or a film containing an organic material such as an organic resin by a plasma CVD method, a sputtering method, or the like. Next, the insulating film is selectively etched by anisotropic etching mainly in the perpendicular direction, to form insulating films 109 (also referred to as sidewalls) in contact with side surfaces of the conductive films 106a, 106b, and 106c (see FIG. 1E). The insulating films 109 are used as masks for doping when lightly doped drain (LDD) regions are to be formed later.

Figure 2A:
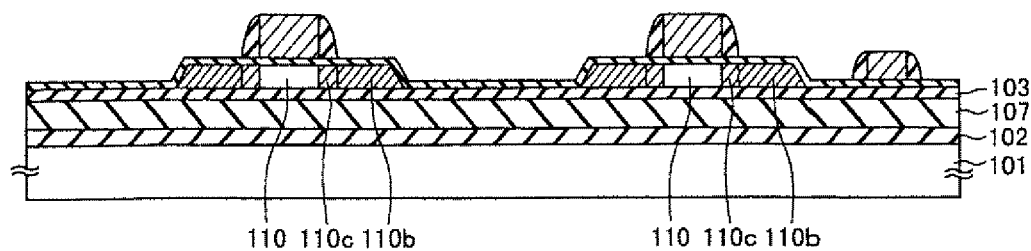
FIGS. 2A to 2C are cross-sectional views showing a method for manufacturing a semiconductor device, according to Embodiment Mode 1 of the present invention, which includes steps following the step of FIG. 1E.
Figure 2B:
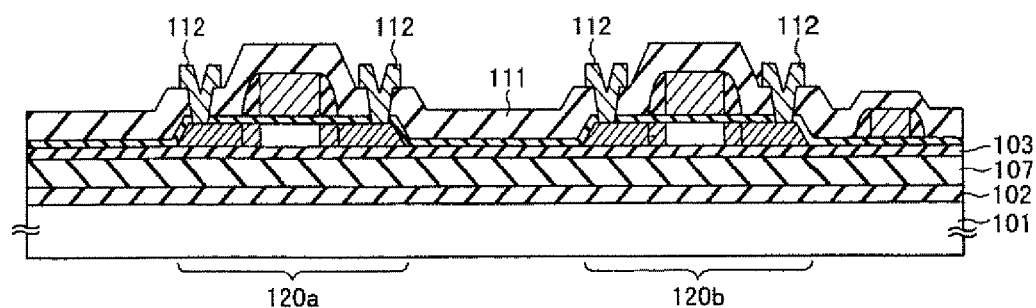

Next, an impurity element is introduced into the semiconductor films 104a and 104b with the use of the conductive films 106a and 106b and the insulating films 109 as masks, whereby channel formation regions 110, first impurity regions 110b, and second impurity regions 110c are formed (see FIG. 2A). The first impurity region 110b can function as a source or drain region of a transistor, and the second impurity region 110c can function as an LDD region. In addition, the concentration of the impurity element contained in the second impurity regions 110c is lower than that of the first impurity regions 110b.

The second impurity regions 110c are provided in this embodiment mode. However, a structure in which the second impurity regions 110c are not provided may be employed. In this structure, the insulating films 109 can be omitted.

Next, an insulating film 111 is formed so as to cover the conductive films 106a, 106b, and 106c. Over the insulating film 111, conductive films 112 each of which can function as a source or drain electrode of each of thin film transistors 120a and 120b are formed (see FIG. 2B).

The insulating film 111 is formed to have a single-layer or layered structure of an inorganic material such as an oxide of silicon or a nitride of silicon, an organic material such as a polyimide, a polyamide, benzocyclobutene, an acrylic, or an epoxy, a siloxane material, or the like by a chemical vapor deposition (CVD) method, a sputtering method, an SOG method, a droplet discharging method, a screen printing method, or the like. The insulating film 111 may have a layered structure. For example, a silicon nitride oxide film and a silicon oxynitride film can be formed for a first layer and a second layer, respectively.

The insulating film 111 and the like are etched by a photolithography method to form contact holes that expose the first impurity regions 110b, and then a conductive film is formed so as to be electrically connected to the semiconductor films in the first impurity regions 110b through the contact holes and is selectively etched, whereby the conductive films 112 are formed. It is to be noted that before the formation of the conductive film, a silicide may be formed on the surfaces of the semiconductor films 104a and 104b which are exposed in the contact holes.

The conductive film 112 is formed to have a single-layer or layered structure of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or compound material containing any of the above elements as its main component by a CVD method, a sputtering method, or the like. The alloy material containing aluminum as its main component corresponds, for example, to a material containing aluminum as its main component and also containing nickel or an alloy material containing aluminum as its main component and also containing nickel and one or both of carbon and silicon. The conductive film 112 may have a layered structure of a barrier film, an aluminum-silicon (Al—Si) film, and a barrier film or layered structure of a barrier film, an aluminum-silicon (Al—Si) film, a titanium nitride film, and a barrier film, for example. It is to be noted that the barrier film corresponds to a thin film formed from titanium, a nitride of titanium, molybdenum, or a nitride of molybdenum. Since aluminum and aluminum silicon have low resistance and are inexpensive, they are optimal materials for forming the conductive films 112. In addition, by providing barrier layers as an upper layer and a lower layer, hillock generation in aluminum or aluminum-silicon can be prevented. In addition, when a barrier film formed from titanium, which is an element having a high reducing property, is formed, even if there is a thin natural oxide film formed over the crystalline semiconductor film, the natural oxide film can be chemically reduced, and a favorable contact with the crystalline semiconductor film can be obtained.

Next, an insulating film 113 is formed so as to cover the insulating film 111 and the conductive films 112, and then an element formation layer 114 including the thin film transistors 120a and 120b and the like are separated from the substrate 101. Specifically, the separation layer 102 is separated from the insulating film 107 (see FIG. 2C). It is to be noted that although the element formation layer 114 is separated from the substrate 101 in this embodiment mode, there is no limitation on this method and the substrate 101 and the separation layer 102 may be removed by etching using grinding processing, abrasion processing, or chemical processing.

Figure 2C:
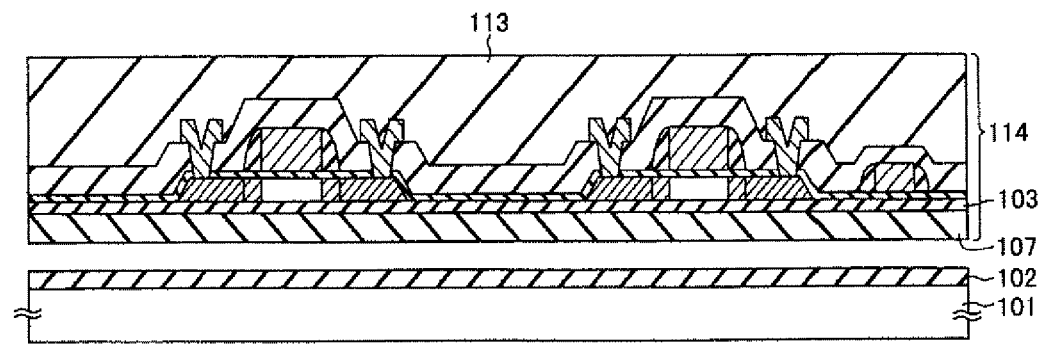
Figure 3A:
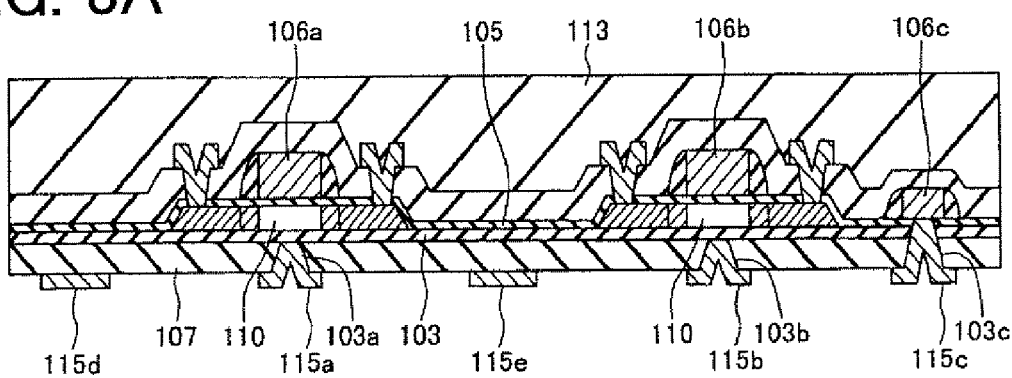
FIGS. 3A and 3B are cross-sectional views showing a method for manufacturing a semiconductor device, according to Embodiment Mode 1 of the present invention, which includes steps following the step of FIG. 2C.
Figure 3B:
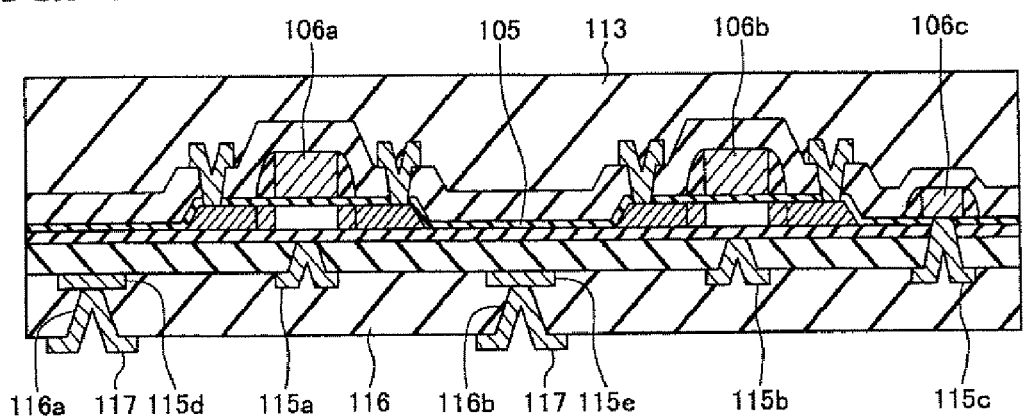

Then, after the element formation layer 114 exposed by the separation is inverted from the state shown in FIG. 2C and transferred, the back side of the element formation layer 114 (in this case, an exposed surface side of the insulating film 107) is processed to form bottom gate electrodes 115a and 115b and conductive films (wirings) 115c to 115e. It is to be noted that the element formation layer 114 is inverted and transferred as described above; thus, in the description below of steps shown in FIGS. 3A and 3B, it is assumed that the state shown in FIGS. 3A and 3B is inverted. Specifically, a photo resist film (not shown) is applied to the exposed surface of the insulating film 107, exposed, and developed, whereby a resist pattern is formed on the exposed surface of the insulating film 107. The insulating film 107 is etched using the resist pattern as a mask to form opening portions 103a and 103b located over the channel formation regions 110 with a bottom gate insulating film 103 interposed therebetween. Each of regions of the bottom gate insulating film 103 which are exposed by the opening portions 103a and 103b has the same area as a region corresponding to the channel formation region 110, or is located within the region corresponding to the channel formation region 110. Subsequently, the resist pattern is removed.

Next, a photo resist film (not shown) is applied to the exposed surface of the insulating film 107, exposed, and developed, whereby a resist pattern is formed on the exposed surface of the insulating film 107. The insulating film 107, the bottom gate insulating film 103, and the top gate insulating film 105 are etched using the resist pattern as a mask, whereby an opening portion 103c located over the conductive film 106c is formed in the insulating film 107, the bottom gate insulating film 103, and the top gate insulating film 105. Subsequently, the resist pattern is removed.

Next, a conductive film is formed in the opening portions 103a to 103c and over the insulating film 107, and then selectively etched. Accordingly, the conductive films 115a and 115b remain over the channel formation regions 110 with the bottom gate insulating film 103 interposed therebetween, the conductive film 115c remains over the conductive film 106c, and the conductive films 115d and 115e remain over the insulating film 107 (see FIG. 3A). Each of the conductive films 115a and 115b can function as a bottom gate electrode. In addition, each of the conductive films 115c, 115d, and 115e can function as a wiring. It is preferred that each of the conductive films 115a and 115b which functions as a bottom gate electrode be of the same or smaller size than the channel formation region 110 and be located within the channel formation region 110.

As the conductive film, it is possible to use, for example, a film formed from an element selected from tantalum (Ta), tungsten (W), titanium (Ti), molybdenum (Mo), aluminum (Al), copper (Cu), chromium (Cr), niobium (Nb), and the like; a film formed from a nitride of any of the above elements (typically, a tantalum nitride film, a tungsten nitride film, or a titanium nitride film); an alloy film in which the above elements are combined (typically, a Mo—W alloy or a Mo—Ta alloy); or a silicide film of any of the above elements (typically, a tungsten silicide film, a titanium silicide film, or a nickel silicide film). The conductive film may have a structure in which a plurality of conductive films is stacked. For example, a tantalum nitride film with a thickness of greater than or equal to 20 nm and less than or equal to 100 nm and a tungsten film with a thickness of greater than or equal to 100 nm and less than or equal to 400 nm can be stacked in this order. Tungsten and tantalum nitride have high heat resistance, and thus can be subjected to heat treatment for the purpose of heat activation after formation of the conductive film. Accordingly, dual-gate TFTs can be formed.

Next, an insulating film 116 is formed so as to cover the conductive films 115a to 115e, and conductive films 117 each of which can function as a wiring are formed over the insulating film 116 (see FIG. 3B).

The insulating film 116 is formed to have a single-layer or layered structure of an inorganic material such as an oxide of silicon or a nitride of silicon, an organic material such as a polyimide, a polyamide, benzocyclobutene, an acrylic, or an epoxy, a siloxane material, or the like by a CVD method, a sputtering method, an SOG method, a droplet discharging method, a screen printing method, or the like. The insulating film 116 may have a layered structure. For example, a silicon nitride oxide film and a silicon oxynitride film can be formed for a first layer and a second layer, respectively.

The insulating film 116 and the like are etched by a photolithography method to form contact holes 116a and 116b that expose the conductive films 115d and 115e, and a conductive film is formed so as to be electrically connected to the conductive films 115d and 115e through the contact holes 116a and 116b and selectively etched, whereby the conductive films 117 are formed.

The conductive film 117 is formed to have a single-layer or layered structure of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or compound material containing any of the above elements as its main component by a CVD method, a sputtering method, or the like. An alloy material containing aluminum as its main component corresponds, for example, to a material containing aluminum as its main component and also containing nickel or an alloy material containing aluminum as its main component and also containing nickel and one or both of carbon and silicon. The conductive film 117 may have a layered structure of a barrier film, an aluminum-silicon (Al—Si) film and a barrier film, or a layered structure of a barrier film, an aluminum-silicon (Al—Si) film, a titanium nitride film and a barrier film, for example. It is to be noted that a barrier film corresponds to a thin film formed from titanium, a nitride of titanium, molybdenum, or a nitride of molybdenum. Since aluminum and aluminum silicon have low resistance and are inexpensive, they are optimal materials for forming the conductive films 117. In addition, by providing barrier layers as an upper layer and a lower layer, hillock generation in aluminum or aluminum-silicon can be prevented. In addition, when a barrier film formed from titanium, which is an element having a high reducing property, is formed, even if there is a thin natural oxide film formed over the conductive films 115d and 115e, the natural oxide film can be chemically reduced, and a favorable contact with the conductive films 115d and 115e can be obtained.

According to Embodiment Mode 1, after the separation layer 102 is formed over the substrate 101 and the TFTs are formed thereover, the TFTs are separated from the separation layer 102 and transferred, and the back side of the element formation layer 114 is processed to form the bottom gate electrodes 115a and 115b, whereby the dual-gate TFTs are formed. Accordingly, the amorphous semiconductor film 104 can be crystallized without the bottom gate insulating film and the bottom gate electrodes being under the amorphous semiconductor film 104. That is, the amorphous semiconductor film 104 can be crystallized without being affected by the bottom gate insulating film and the bottom gate electrodes.

In addition, in Embodiment Mode 1, upper and lower portions of the TFTs are provided with the wirings 106c, 112, 115c to 115e, and 117. Thus, the area of a device can be reduced.

Further, in Embodiment Mode 1, the threshold voltage $V_{th}$ can be shifted (adjusted) by application of a voltage to the bottom gate electrodes. In addition, channels are formed in upper and lower portions by application of a voltage to each of the top gate electrode and the bottom gate electrode; as a result, a large on current can be obtained.

Embodiment Mode 2

Figure 4:
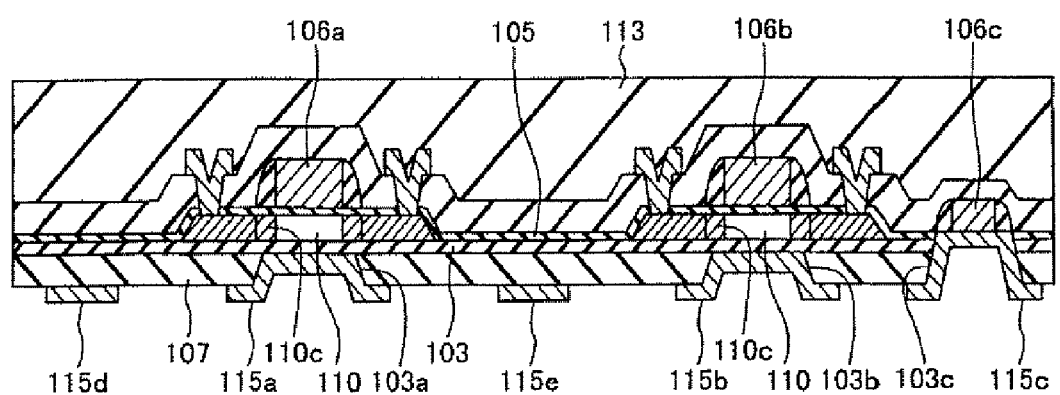
FIG. 4 is a cross-sectional view showing a method for manufacturing a semiconductor device, according to Embodiment Mode 2 of the present invention.

FIG. 4 is a cross-sectional view illustrating a method for manufacturing a semiconductor device, according to Embodiment Mode 2 of the present invention. A step shown in FIG. 4 corresponds to the step shown in FIG. 3A. The same portions as those in FIGS. 3A and 3B are denoted by the same reference numerals, and only portions that are different from those of Embodiment Mode 1 are described.

The opening portions 103a and 103b are formed in the insulating film 107 to be located over the channel formation regions 110 with the gate insulating film 103 interposed therebetween. Each of the regions of the bottom gate insulating film 103 which are exposed by the opening portions 103a and 103b extends outward from the region corresponding to the channel formation region 110 and at the same time has the same area as a region corresponding to the channel formation region 110 and the second impurity region (LDD region) 110c, or is located within the region corresponding to the channel formation region 110 and the second impurity region (LDD region) 110c (see FIG. 4).

Effects similar to those of Embodiment Mode 1 can also be obtained in Embodiment Mode 2.

Embodiment Mode 3

Figure 5A:
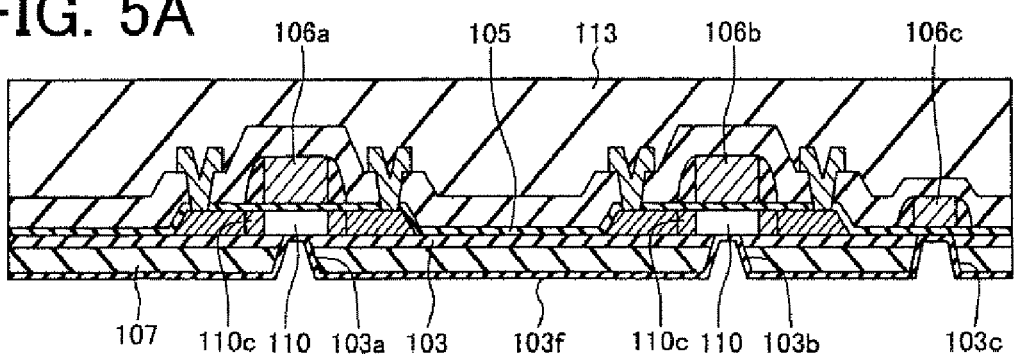
FIGS. 5A and 5B are cross-sectional views showing a method for manufacturing a semiconductor device, according to Embodiment Mode 3 of the present invention.
Figure 5B:
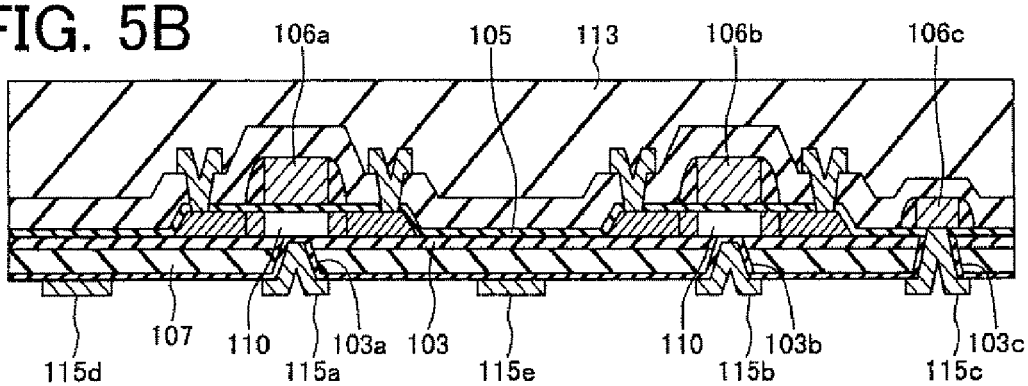

FIGS. 5A and 5B are cross-sectional views illustrating a method for manufacturing a semiconductor device, according to Embodiment Mode 3 of the present invention. Steps shown in FIGS. 5A and 5B correspond to the step shown in FIG. 3A. The same portions as those of FIGS. 3A and 3B are denoted by the same reference numerals, and only portions that are different from those of Embodiment Mode 1 are described.

In Embodiment Mode 1, in the step shown in FIG. 1A, the insulating film 107 is formed over the separation layer 102, the bottom gate insulating film 103 is formed over the insulating film 107, and the semiconductor film 104 is formed over the bottom gate insulating film 103. On the other hand, in this embodiment mode, the bottom gate insulating film 103 as described in Embodiment Mode 1 is used as an insulating film simply, not as a bottom gate insulating film. That is, in a step shown in FIG. 1A of this embodiment mode, it is assumed that the insulating film 107 is formed over the separation layer 102, the insulating film 103 is formed over the insulating film 107, and the semiconductor film 104 is formed over the insulating film 103.

The insulating films 107 and 103 are etched, whereby the opening portions 103a and 103b located over the channel formation regions 110 and the opening portion 103c located over the wiring 106c are formed in the insulating films 107 and 103. Each of the regions of the semiconductor film which are exposed by the opening portions 103a and 103b has the same area as a region corresponding to the channel formation region 110, or is located within the region corresponding to the channel formation region 110 (see FIG. 5A).

Next, a bottom gate insulating film 103f is formed over the insulating film 107 and in the opening portions 103a to 103c (see FIG. 5A). The bottom gate insulating film 103f is thinner than the bottom gate insulating film of Embodiment Mode 1.

Then, by etching of the bottom gate insulating film 103f and the top gate insulating film 105, an opening portion is formed in the bottom gate insulating film 103f and the top gate insulating film 105, thereby exposing the wiring 106c. Subsequently, in a similar manner to that of Embodiment Mode 1, the bottom gate electrodes 115a and 115b and the conductive films (wirings) 115c to 115e are formed over the bottom gate insulating film 103f and the conductive film 106c. Thus, in the opening portion, the conductive film 115c is electrically connected to the wiring 106c (see FIG. 5B). Accordingly, dual-gate TFTs can be formed.

Effects similar to those of Embodiment Mode 1 can also be obtained in Embodiment Mode 3. In addition, in Embodiment Mode 3, since the bottom gate insulating film 103f is thinner than that of Embodiment Mode 1, power consumption of a device can be reduced compared with Embodiment Mode 1.

In addition, in this embodiment mode, the bottom gate insulating film 103f is formed in the step shown in FIG. 5A in order to form the bottom gate insulating film 103f that is thinner than the bottom gate insulating film of Embodiment Mode 1 as described above.

Specifically, in the case where the thinner bottom gate insulating film as described in Embodiment Mode 3 is formed in the step shown in FIG. 1A as described in Embodiment Mode 1, the etching for forming the opening portions 103a and 103b in the insulating film 107 in the step shown in FIG. 3A may result in removal of the thinner bottom gate insulating film in the opening portions by the etching. In contrast, in the case where the thinner bottom gate insulating film 103f is formed in the step shown in FIG. 5A as described in Embodiment Mode 3 and the bottom gate electrodes 115a and 115b are formed over the bottom gate insulating film 103f, it can be ensured that the thinner bottom gate insulating film 103f is formed.

In Embodiment Mode 3, the insulating film 107 is formed over the separation layer 102, the insulating film 103 is formed over this insulating film 107, and the semiconductor film 104 is formed over this insulating film 103. However, the insulating film 107 may be formed over the separation layer 102, and the semiconductor film 104 may be formed over the insulating film 107. That is, the insulating film 103 may be omitted.

Embodiment Mode 4

Figure 6A:
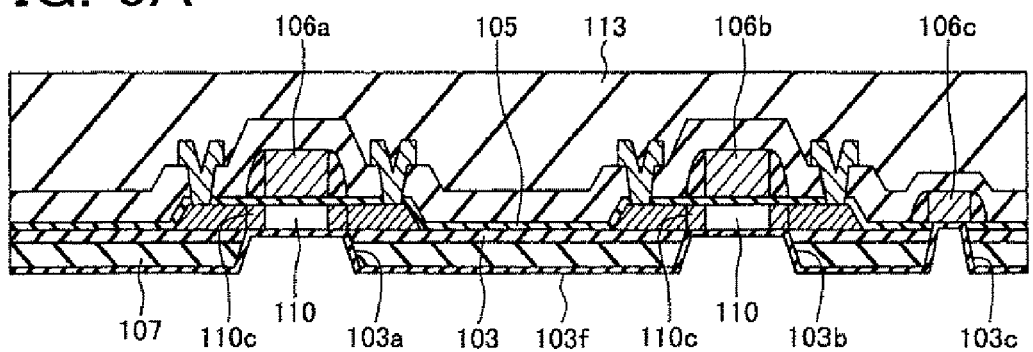
FIGS. 6A and 6B are cross-sectional views showing a method for manufacturing a semiconductor device, according to Embodiment Mode 4 of the present invention.
Figure 6B:
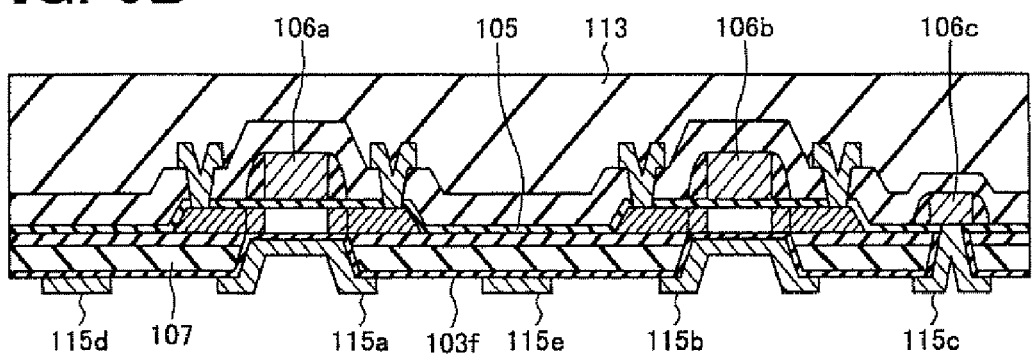

FIGS. 6A and 6B are cross-sectional views illustrating a method for manufacturing a semiconductor device, according to Embodiment Mode 4 of the present invention. Steps shown in FIGS. 6A and 6B correspond to the steps shown in FIGS. 5A and 5B, and the same portions as those of FIGS. 5A and 5B are denoted by the same reference numerals, and only portions that are different from those of Embodiment Mode 3 are described.

Each of regions of the semiconductor film which are exposed by the opening portions 103a and 103b in the insulating films 107 and 103 extends outward from the region corresponding to the channel formation region 110 and at the same time has the same area as the region corresponding to the channel formation region 110 and the second impurity region (the LDD region) 110c or is located within the region corresponding to the channel formation region 110 and the second impurity region (the LDD region) 110c (see FIGS. 6A and 6B).

Effects similar to those of Embodiment Mode 3 can also be obtained in Embodiment Mode 4 described above.

Embodiment Mode 5

Figure 7A:
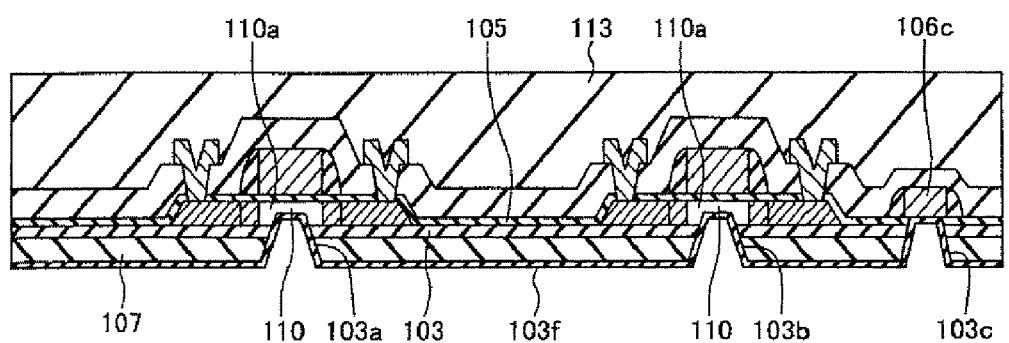
FIGS. 7A and 7B are cross-sectional views showing a method for manufacturing a semiconductor device, according to Embodiment Mode 5 of the present invention.
Figure 7B:
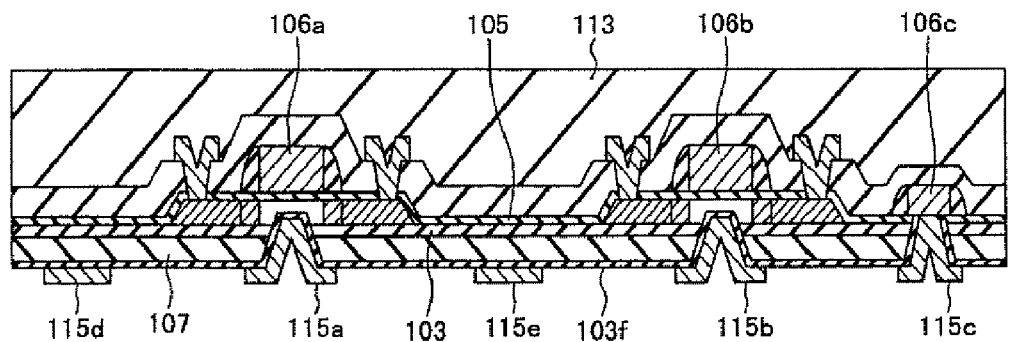

FIGS. 7A and 7B are cross-sectional views illustrating a method for manufacturing a semiconductor device, according to Embodiment Mode 5 of the present invention. Steps shown in FIGS. 7A and 7B correspond to the steps shown in FIGS. 5A and 5B, and the same portions as those of FIGS. 5A and 5B are denoted by the same reference numerals, and only portions that are different from those of Embodiment Mode 3 are described.

The insulating films 107 and 103, the top gate insulating film 105, and the crystalline semiconductor film are etched, whereby the opening portions 103a and 103b located over the channel formation regions 110 are formed in the insulating films 107 and 103 and the crystalline semiconductor film and the opening portion 103c located over the wiring 106c is formed in the insulating films 107 and 103 and the top gate insulating film 105. In the crystalline semiconductor film exposed by the opening portions 103a and 103b, thin film regions 110a in which the crystalline semiconductor film is thinned are formed (see FIG. 7A).

Specifically, with the etching selectivity between the crystalline semiconductor film and the conductive film 106c, the insulating films 107 and 103 and the top gate insulating film 105 are etched. Then, with the etching selectivity between the conductive film 106c and the insulating film, the crystalline semiconductor film is etched. Accordingly, the opening portions 103a to 103c are formed. Each of the thin film regions 110a of the crystalline semiconductor film which are exposed by the opening portions 103a and 103b has the same area as the region corresponding to the channel formation region 110 or is located within the region corresponding to the channel formation region 110 (see FIG. 7A).

Next, the bottom gate insulating film 103f is formed over the insulating film 107 and in the opening portions 103a to 103c. The bottom gate insulating film 103f is thinner than the bottom gate insulating film of Embodiment Mode 1.

Then, by etching of the bottom gate insulating film 103f, an opening portion is formed in the bottom gate insulating film 103f, thereby exposing the wiring 106c. Subsequently, in a similar manner to that in Embodiment Mode 1, the bottom gate electrodes 115a and 115b and the conductive films (wirings) 115c to 115e are formed over the bottom gate insulating film 103f and the conductive film 106c. Thus, in the opening portion, the conductive film 115c is electrically connected to the wiring 106c (see FIG. 7B). Accordingly, dual-gate TFTs can be formed.

Effects similar to those of Embodiment Mode 3 can also be obtained in Embodiment Mode 5. In addition, in Embodiment Mode 5, the thin film regions 110a in which the crystalline semiconductor film is thinned are formed in regions of the crystalline semiconductor film which correspond to the channel formation regions 110; therefore, the subthreshold swing can be made small. As a result, power consumption of a device can be reduced compared with Embodiment Mode 3.

In addition, in Embodiment Mode 5, the thinner thin film regions 110a are formed as described above. Accordingly, upper and lower inversion layers easily overlap with each other to reduce penetration of an electric field from the drain to the source. Thus, a short-channel effect can be suppressed. It is to be noted that suppression of a short-channel effect, which can easily be achieved in this embodiment mode where the thin film regions 110*a* are formed, can also be achieved in Embodiment Modes 1 to 4 depending on conditions such as the thickness of the crystalline semiconductor film.

Embodiment Mode 6

In Embodiment Mode 6, examples of the usage of a semiconductor device described in Embodiment Modes 1 to 5 are described. Specifically, application examples of a semiconductor device that is capable of inputting and outputting data without contact is described below with reference FIGS. 8A to 5C and FIGS. 9A to 9H. The semiconductor device that is capable of inputting and outputting data without contact is also referred to as an RFID tag, an ID tag, an IC tag, an IC chip, an RF tag, a wireless tag, an electronic tag, or a wireless chip depending on the usage pattern.

Figure 8A:
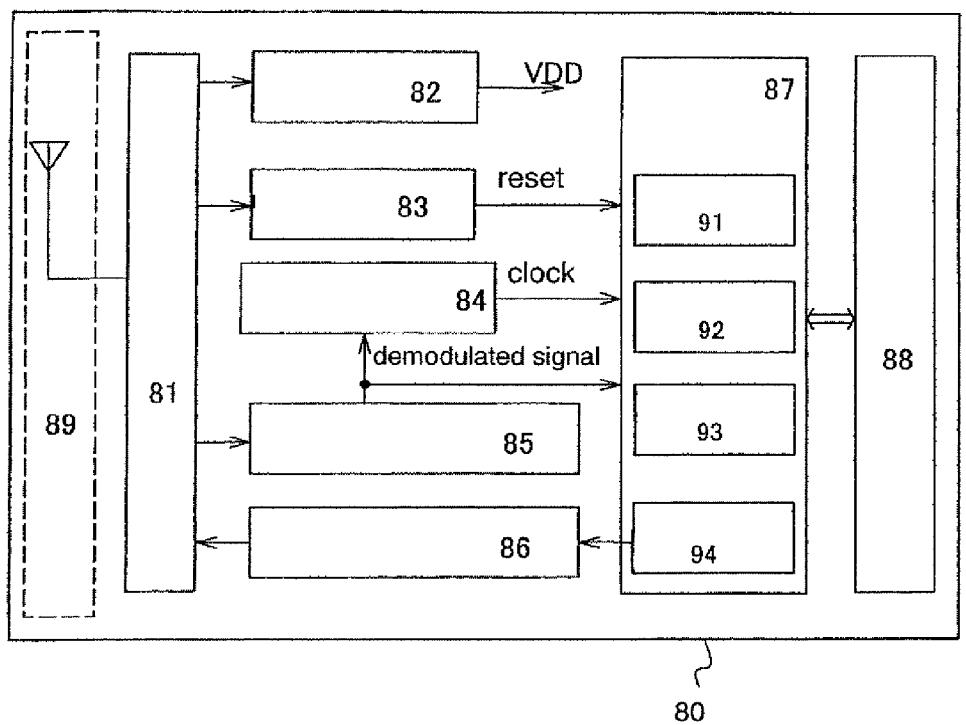
FIGS. 8A to 8C each show an example of a usage pattern of a semiconductor device of the present invention.

A semiconductor device 80 has a function of communicating data without contact and includes a high frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG. 8A). The high frequency circuit 81 is a circuit that receives a signal from the antenna 89, and outputs a signal received from the data modulation circuit 86 through the antenna 89. The power source circuit 82 is a circuit that generates a power source potential from the received signal. The reset circuit 83 is a circuit that generates a reset signal. The clock generation circuit 84 is a circuit that generates various clock signals based on the received signal input from the antenna 89. The data demodulation circuit 85 is a circuit that demodulates the received signal and outputs the signal to the control circuit 87. In addition, the control circuit 87 includes a code extraction circuit 91, a code determination circuit 92, a CRC judging circuit 93, and an output unit circuit 94. The code extraction circuit 91 is a circuit that separately extracts a plurality of codes included in an instruction transmitted to the control circuit 87. The code determination circuit 92 is a circuit that compares the extracted code and a code corresponding to a reference to determine the content of the instruction. The CRC circuit is a circuit that detects the presence or absence of a transmission error or the like based on the determined code.

Subsequently, an example of an operation of the aforementioned semiconductor device is described. First, a radio signal is received by the antenna 89. The radio signal is transmitted to the power supply circuit 82 via the high frequency circuit 81, and a high power supply potential (hereinafter referred to as VDD) is generated. The VDD is supplied to each circuit included in the semiconductor device 80. In addition, a signal transmitted to the data demodulation circuit 85 via the high frequency circuit 81 is demodulated (hereinafter the signal is referred to as a demodulated signal). Further, a signal transmitted through the reset circuit 83 and the clock generation circuit 84 via the high frequency circuit 81 and the demodulated signal are transmitted to the control circuit 87. The signals transmitted to the control circuit 87 are analyzed by the code extraction circuit 91, the code determination circuit 92, the CRC determination circuit 93, and the like. Then, based on the analyzed signals, information of the semiconductor device which is stored in the memory circuit 88 is output. The output information of the semiconductor device is encoded through the output unit circuit 94. Furthermore, the encoded information of the semiconductor device 80 is, through the data modulation circuit 86, transmitted by the antenna 89 as a radio signal. It is to be noted that a low power source potential (hereinafter referred to as VSS) is common in the plural circuits included in the semiconductor device 80, and VSS can be GND.

Thus, data of the semiconductor device can be read by transmitting a signal from a reader/writer to the semiconductor device 80 and receiving the signal transmitted from the semiconductor device 80 by the reader/writer The semiconductor device 80 may be either a type where no power supply (battery) is built-in but electromagnetic waves are used to supply a power supply voltage to each circuit, or a type where both electromagnetic waves and a power supply (battery) are used to generate a power supply voltage for each circuit.

By applying a manufacturing method described in any of Embodiment Modes 1 to 5 to the high frequency circuit 81, the power source circuit 82, the reset circuit 83, the clock generation circuit 84, the data demodulation circuit 85, the data modulation circuit 86, the control circuit 87, and the memory circuit, a semiconductor device can be obtained at low cost.

Figure 8B:
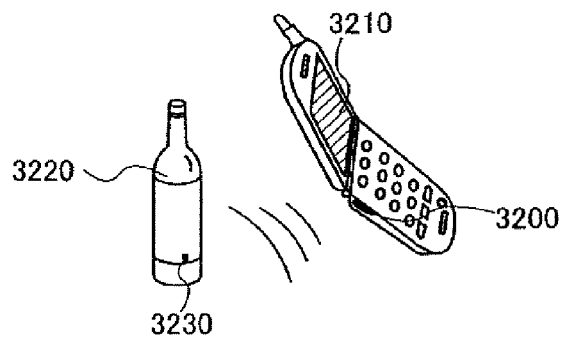
Figure 8C:
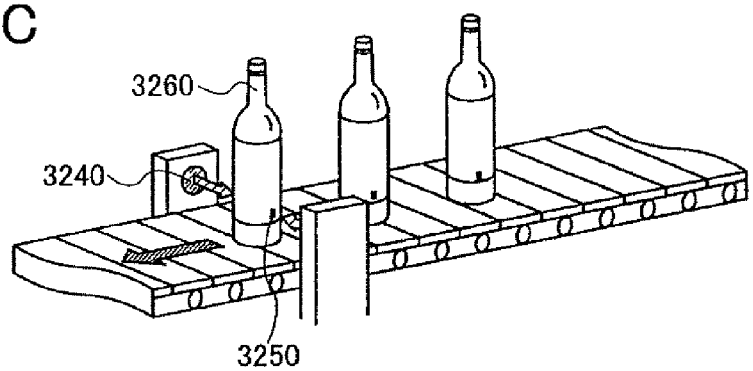
Figure 9A:
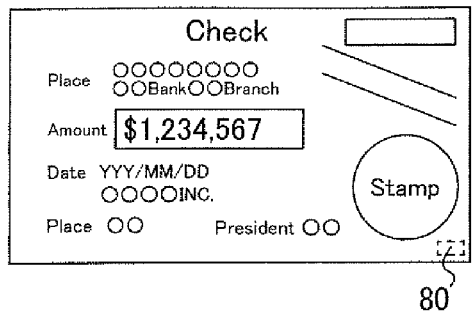
FIGS. 9A to 9H each show an example of a usage pattern of a semiconductor device of the present invention.
Figure 9B:
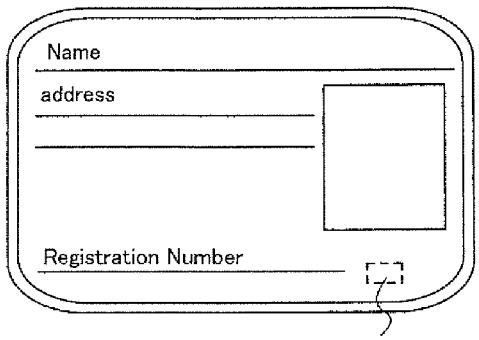
Figure 9C:
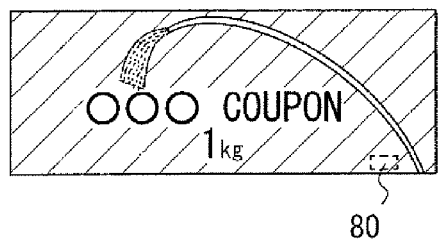
Figure 9D:
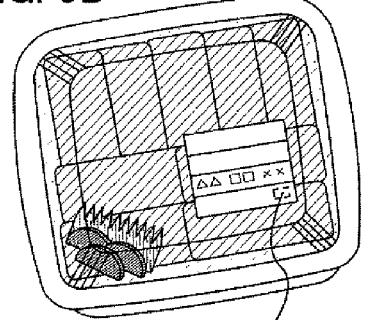
Figure 9E:
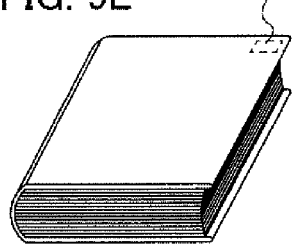
Figure 9F:
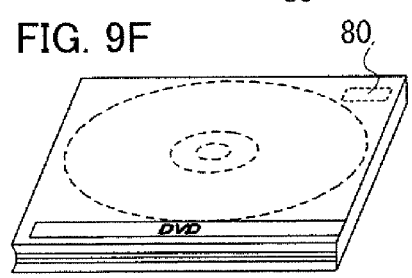
Figure 9G:
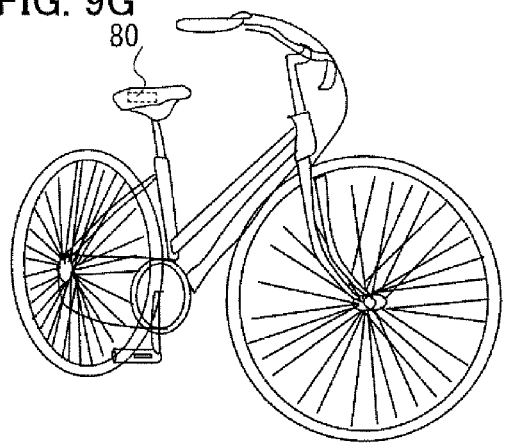
Figure 9H:
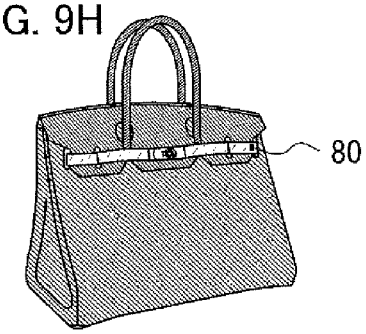

Next, examples of the usage of the semiconductor device that is capable of inputting and outputting data without contact are described. A reader/writer 3200 is attached to a side surface of a portable terminal having a display portion 3210, and a semiconductor device 3230 is attached to a side surface of an product 3220 (FIG. 8B). When the reader/writer 3200 is held over the semiconductor device 3230 included in the product 3220, the display portion 3210 displays information on the product, such as a row material, a place of origin, inspection results for each production step, a history of distribution process, description of the product, or the like. In addition, when a product 3260 is transferred with a belt conveyor, the product 3260 can be inspected using a reader/writer 3240 and a semiconductor device 3250 that is attached to the product 3260 (FIG. 8C). As thus described, with the use of the semiconductor device in a system, information can be acquired easily, and higher function and higher added value can be realized.

In addition, as a signal transmission system in the above semiconductor device that is capable of inputting and outputting data without contact, an electromagnetic coupling system, an electromagnetic induction system, a microwave system, or the like can be used. The transmission system may be appropriately selected by a practitioner in consideration of an intended use, and an optimum antenna may be provided in accordance with the transmission method.

In the case where, for example, an electromagnetic coupling method or an electromagnetic induction method (e.g., 13.56 MHz band) is used as the signal transmission method in the semiconductor device, electromagnetic induction resulting from a change in magnetic field density is used. Therefore, a conductive film functioning as an antenna is formed into an annular shape (e.g., a loop antenna) or a spiral shape (e.g., a spiral antenna).

Alternatively, in the case where a microwave method (e.g., UHF band (860 MHz to 960 MHz band) or 2.45 GHz band) is used as the signal transmission method in the semiconductor device, the shape such as the length of the conductive layer functioning as an antenna may be set as appropriate in consideration of the wavelength of an electromagnetic wave used for signal transmission. For example, the conductive film functioning as an antenna can be formed into a linear shape (e.g., a dipole antenna), a flat shape (e.g., a patch antenna), a ribbon-like shape, or the like. In addition, the shape of the conductive film functioning as an antenna is not limited to a linear shape but may be a curved shape, a meandering shape, or a combination thereof in consideration of the wavelength of an electromagnetic wave. Whichever shape the conductive film functioning as an antenna has, an element group can be prevented from being broken or the like by controlling the pressure applied to the element group while the pressure is monitored so as not to give excessive pressure to the element group, in attachment of the element group as described in the above embodiment mode.

The conductive film functioning as an antenna is formed using a conductive material by a CVD method, a sputtering method, a printing method such as screen printing or gravure printing, a droplet discharging method, a dispenser method, a plating method, or the like. The conductive material is formed to have a single-layer or layered structure of an element selected from aluminum (Al), titanium (Ti), silver (Ag), copper (Cu), gold (Au), platinum (Pt), nickel (Ni), palladium (Pd), tantalum (Ta), and molybdenum (Mo); or an alloy or compound material containing any of the above elements as its main component.

For example, in the case of forming the conductive film functioning as an antenna by a screen printing method, the conductive film can be formed by selective printing of a conductive paste in which conductive particles each having a grain size of greater than or equal to several nm and less than or equal to several tens of μm are dissolved or dispersed in an organic resin. As the conductive particle, a metal particle of one or more metals of silver (Ag), gold (Au), copper (Cu), nickel (Ni), platinum (Pt), palladium (Pd), tantalum (Ta), molybdenum (Mo), titanium (Ti), and the like, a fine particle of silver halide, or a dispersive nanoparticle can be used. In addition, as the organic resin contained in the conductive paste, one or a plurality of organic resins each serving as a binder, a solvent, a dispersant, or a coating of the metal particle can be used. Typically, organic resins such as an epoxy resin and a silicone resin can be given as examples. In addition, for forming the conductive film, baking is preferably performed after the conductive paste is applied. For example, when fine particles (e.g., particles each having a grain size of greater than or equal to 1 nm and less than or equal to 100 nm) containing silver as its main component are used as a material of the conductive paste, the conductive paste is baked and hardened at temperatures in the range of greater than or equal to 150° C. and less than or equal to 300° C. to obtain the conductive film. Alternatively, fine particles containing solder or lead-free solder as its main component may be used. In this case, fine particles each having a grain size of less than or equal to 20 μm are preferably used. Solder or lead-free solder has an advantage such as low cost.

It is to be noted that an applicable range of the flexible semiconductor device is wide in addition to the above, and the flexible semiconductor device can be applied to any product as long as it is a product whose production, management, or the like can be supported by clarifying information such as the history of an object without contact. For example, the semiconductor device can be provided to bills, coins, securities, certificates, bearer bonds, packing containers, books, recording media, personal belongings, vehicles, food, clothing, health products, commodities, medicine, electronic devices, and the like. These examples are described with reference to FIGS. 9A to 9H.

The bills and coins are money distributed to the market and include one valid in a certain area (a cash voucher), memorial coins, and the like. The securities refer to checks, certificates, promissory notes, and the like (see FIG. 9A). The certificates refer to driver's licenses, certificates of residence, and the like (see FIG. 9B). The bearer bonds refer to stamps, rice coupons, various gift certificates, and the like (see FIG. 9C). The packing containers refer to wrapping paper for food containers and the like, plastic bottles, and the like (see FIG. 9D). The books refer to hardbacks, paperbacks, and the like (see FIG. 9E). The recording media refer to DVD software, video tapes, and the like (see FIG. 9F). The vehicles refer to wheeled vehicles such as bicycles, vessels, and the like (see FIG. 9G). The personal belongings refer to bags, glasses, and the like (see FIG. 9H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-panel TV sets), cellular phones, and the like.

Forgery can be prevented by providing the semiconductor device 80 for the bills, the coins, the securities, the certificates, the bearer bonds, or the like. Further, the efficiency of an inspection system, a system used in a rental shop, or the like can be improved by providing the semiconductor device 80 for the packing containers, the books, the recording media, the personal belongings, the food, the commodities, the electronic devices, or the like. Forgery or theft can be prevented by providing the semiconductor device 80 for the vehicles, the health products, the medicine, or the like; and in the case of the medicine, medicine can be prevented from being taken mistakenly. The semiconductor device 80 can be provided by being attached to the surface or being embedded in the object. For example, in the case of a book, the semiconductor device 80 may be embedded in the paper; and in the case of a package made of an organic resin, the semiconductor device 80 may be embedded in the organic resin. With the use of the flexible semiconductor device, even in the case where it is provided to paper or the like, breakage or the like of an element included in the semiconductor device can be prevented by providing a semiconductor device having the structure described in any of the above embodiment modes.

As described above, the efficiency of an inspection system, a system used in a rental shop, or the like can be improved by providing the semiconductor device for the packing containers, the books, the recording media, the personal belongings, the food, the commodities, the electronic devices, or the like. Moreover, forgery or theft can be prevented by providing the semiconductor device for the vehicles. Further, by implanting the semiconductor device in a creature such as an animal, an individual creature can be easily identified. For example, by implanting the semiconductor device with a sensor in a creature such as livestock, its health conditions such as body temperature as well as its birth year, sex, breed, or the like can be easily managed.

It is to be noted that this embodiment mode can be combined with the structure of the semiconductor device or the method for manufacturing the semiconductor device which is described in any other embodiment mode in this specification. That is, the structures of the semiconductor device, which are described in Embodiment Modes 1 to 5, can be applied to the semiconductor device described in this embodiment mode.

Embodiment Mode 7

In this embodiment mode, a method for manufacturing the semiconductor device capable of inputting and outputting data without contact, which is described in Embodiment Mode 6, is described with reference to FIGS. 10A to 10D, FIGS. 11A to 11C, FIGS. 12A and 12B, and FIG. 13. It is to be noted that in this embodiment mode, a semiconductor device is manufactured in such a way that an element such as a thin film transistor is provided over a supporting substrate (a temporary substrate) and then transferred to a flexible substrate.

First, a separation layer 303 is formed over one surface of a substrate 301 with an insulating film 302 interposed therebetween. Subsequently, an insulating film 304 that functions as a base film, the bottom gate insulating film 103, and a semiconductor film 305 (e.g., a film containing amorphous silicon or an amorphous semiconductor film) are stacked thereover (see FIG. 10A). It is to be noted that the insulating film 302, the separation layer 303, the insulating film 304, the bottom gate insulating film 103, and the semiconductor film 305 can be formed in succession.

As the substrate 301, a substrate similar to the substrate 101 described in Embodiment Mode 1 may be used.

Each of the insulating film 302 and the insulating film 304 is formed of a silicon oxide film, a silicon nitride film, a silicon oxynitride film, a silicon nitride oxide film, or the like by a CVD method, a sputtering method, or the like. For example, in the case where the insulating film 302 or the insulating film 304 has a two-layer structure, a silicon nitride oxide film may be formed as a first layer and a silicon oxynitride film may be formed as a second layer. Alternatively, a silicon nitride film may be formed as a first layer and a silicon oxide film may be formed as a second layer.

As the separation layer 303, a layer similar to the separation layer 102 described in Embodiment Mode 1 may be used. In addition, as the bottom gate insulating film 103, a film similar to that described in Embodiment Mode 1 may be used.

The amorphous semiconductor film 305 is formed to a thickness of greater than or equal to 25 nm and less than or equal to 200 nm (preferably, greater than or equal to 30 nm and less than or equal to 150 nm) by a sputtering method, an LPCVD method, a plasma CVD method, or the like.

Next, the amorphous semiconductor film 305 is crystallized by laser beam irradiation. The amorphous semiconductor film 305 may be crystallized by a method in which laser beam irradiation is combined with a thermal crystallization method using RTA or an annealing furnace or with a thermal crystallization method using a metal element that promotes the crystallization, or the like. Then, the obtained crystalline semiconductor film is etched to have a desired shape to form semiconductor films 305a to 305f. A gate insulating film 306 is formed so as to cover the semiconductor films 305a to 305f (see FIG. 10B).

The gate insulating film 306 is formed using an insulating material such as silicon oxide, silicon nitride, silicon oxynitride, or silicon nitride oxide by a CVD method, a sputtering method, or the like. For example, in the case where the gate insulating film 306 has a two-layer structure, a silicon oxynitride film may be formed as a first layer and a silicon nitride oxide film may be formed as a second layer Alternatively, a silicon oxide film may be formed as a first Layer and a silicon nitride film may be formed as a second layer.

It is to be noted that since the semiconductor film 305f is used as an electrode of a capacitor in this embodiment mode, an impurity element is introduced into the semiconductor film 305f. Specifically, before or after the formation of the gate insulating film 306, the semiconductor films 305a to 305e are covered with a resist, and an n-type or p-type impurity element can be selectively introduced into the semiconductor film 305f by an ion doping method or an ion implantation method. As an n-type impurity element, phosphorus (P), arsenic (As), or the like can be used. As a p-type impurity element, boron (B), aluminum (Al), gallium (Ga), or the like can be used. In this embodiment mode, phosphorus (P), which is an n-type impurity element, is used and selectively introduced into the semiconductor film 305f.

Next, a first conductive film and a second conductive film are stacked over the gate insulating film 306. In this embodiment mode, the first conductive film is formed to a thickness of greater than or equal to 20 nm and less than or equal to 100 nm by a CVD method, a sputtering method, or the like. The second conductive film is formed to a thickness of greater than or equal to 100 nm and less than or equal to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb), and the like, or an alloy or compound material containing any of the above elements as its main component. Alternatively, a semiconductor material typified by polycrystalline silicon doped with an impurity element such as phosphorus can also be used. As examples of a combination of the first conductive film and the second conductive film, a tantalum nitride film and a tungsten film, a tungsten nitride film and a tungsten film, a molybdenum nitride film and a molybdenum film, and the like are given. Tungsten and tantalum nitride have high heat resistance; therefore, heat treatment for the purpose of heat activation can be performed after the formation of the first conductive film and the second conductive film. In addition, in the case of not a two-layer structure but a three-layer structure, a layered structure of a molybdenum film, an aluminum film, and a molybdenum film may be employed.

Next, a resist mask is formed by a photolithography method, and etching for forming gate electrodes and gate lines is performed. Thus, gate electrodes 307 are formed above the semiconductor films 305a to 305f In this embodiment mode, a layered structure of a first conductive film 307a and a second conductive film 307b is given as an example of the gate electrode 307.

Next, an n-type impurity element is added at low concentration to the semiconductor films 305a to 305f with the use of the gate electrodes 307 as masks by an ion doping method or an ion implantation method. Then, a resist mask is selectively formed by a photolithography method, and a p-type impurity element is added at high concentration. In this embodiment mode, phosphorus (P), which is an n-type impurity element, is selectively introduced into the semiconductor films 305a to 305f with the use of the gate electrodes 307 as masks so as to be contained at concentrations of greater than or equal to $1\times10^{15}$ atoms/cm$^3$ and less than or equal to $1\times10^{19}$ atoms/cm$^3$. Thus, n-type impurity regions 308 are formed. Subsequently, the semiconductor films 305a, 305b, 305d, and 305f are covered with a resist. Boron (B), which is a p-type impurity element, is selectively introduced into the semiconductor films 305c and 305e so as to be contained at concentrations of greater than or equal to $1\times10^{19}$ atoms/cm$^3$ and less than or equal to $1\times10^{20}$ atoms/cm$^3$. Thus, p-type impurity regions 309 are formed (see FIG. 10C).

Next, an insulating film is formed so as to cover the gate insulating film 306 and the gate electrodes 307. The insulating film is formed to have a single-layer or layered structure of a film containing an inorganic material such as silicon, an oxide of silicon, or a nitride of silicon, or a film containing an organic material such as an organic resin by a plasma CVD method, a sputtering method, or the like. Next, the insulating film is selectively etched by anisotropic etching mainly in the perpendicular direction, to form insulating films 310 (also referred to as sidewalls) in contact with side surfaces of the gate electrodes 307. The insulating films 310 are used as masks for doping when lightly doped drain (LDD) regions are formed.

Next, an n-type impurity element is added to the semiconductor films 305a, 305b, 305d, and 305f at high concentration, using the resist mask formed by a photolithography method, the gate electrodes 307, and the insulating films 310 as masks. Thus, n-type impurity regions 311 are formed. In this embodiment mode, phosphorus (P), which is an n-type impurity element, is selectively introduced into the semiconductor films 305a, 305b, 305d, and 305f so as to be contained at concentrations of greater than or equal to $1\times10^{19}$ atoms/cm$^3$ and less than or equal to $1\times10^{20}$ atoms/cm$^3$. Accordingly, the n-type impurity region 311 contains the n-type impurity element at higher concentration than the impurity region 308.

Through the above-described steps, n-channel thin film transistors 300a, 300b, and 300d; p-channel thin film transistors 300c and 300e; and a capacitor 300f are formed (see FIG. 10D).

In the n-channel thin film transistor 300a, a channel formation region is formed in a region of the semiconductor film 305a, which overlaps with the gate electrode 307; the impurity regions 311 each of which forms a source or drain region are formed in regions of the semiconductor film 305a, which do not overlap with the gate electrode 307 and the insulating films 310; and low concentration impurity regions (LDD regions) are formed in regions of the semiconductor film 305a, which overlap with the insulating film 310 between the channel formation region and each of the impurity regions 311. In a similar manner, the channel formation regions, the low concentration impurity regions, and the impurity regions 311 are also formed in the n-channel thin film transistors 300b and 300d.

In the p-channel thin film transistor 300c, a channel formation region is formed in a region of the semiconductor film 305c, which overlaps with the gate electrode 307; and the impurity regions 309 each of which forms a source or drain region are formed in regions of the semiconductor film 305c, which do not overlap with the gate electrode 307. In a similar manner, the channel formation region and the impurity regions 309 are also formed in the p-channel thin film transistor 300e. It is to be noted that LDD regions are not provided in each of the p-channel thin film transistors 300c and 300e in this embodiment mode, but the LDD regions may be provided in the p-channel thin film transistor or the LDD regions are not necessarily provided in the n-channel thin film transistor.

Next, an insulating film with a single-layer or layered structure is formed so as to cover the semiconductor films 305a to 305f, the gate electrodes 307, and the like. Over the insulating film, the impurity regions 309 and 311 each of which forms a source or drain regions of the thin film transistors 300a to 300e, and conductive films 313 that are electrically connected to one electrode of the capacitor 300f are formed (see FIG. 11A). The insulating film is formed to have a singe-layer or layered structure of an inorganic material, such as an oxide of silicon or a nitride of silicon, an organic material such as a polyimide, a polyamide, benzocyclobutene, an acrylic, or an epoxy, a siloxane material, or the like by a CVD method, a sputtering method, an SOG method, a droplet discharging method, a screen printing method, or the like. In this embodiment mode, the insulating film is formed to have a two-layer structure, and a silicon nitride oxide film is formed as a first insulating film 312a and a silicon oxynitride film is formed as a second insulating film 312b. Further, the conductive film 313 can form a source or drain electrode of the thin film transistors 300a to 300e. It is to be noted that the siloxane material corresponds to a material including an Si—O—Si bond. Siloxane has a skeleton structure formed of a bond of silicon (Si) and oxygen (O). As a substituent of the siloxane, an organic group containing at least hydrogen (e.g., an alkyl group or an aromatic hydrocarbon) is used. A fluoro group may be included in the organic group.

It is to be noted that, before the insulating films 312a and 312b are formed or after one or a plurality of thin films of the insulating films 312a and 312b is formed, heat treatment for recovering crystallinity of the semiconductor films, activating the impurity elements added to the semiconductor films, or hydrogenating the semiconductor films, may be performed. For the heat treatment, thermal annealing, a laser annealing method, an RTA method, or the like may be employed.

The conductive film 313 is formed to have a single-layer or layered structure of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or compound material containing any of the above elements as its main component by a CVD method, a sputtering method, or the like. An alloy material containing aluminum as its main component corresponds, for example, to a material containing aluminum as its main component and also containing nickel or an alloy material containing aluminum as its main component and also containing nickel and one or both of carbon and silicon. The conductive film 313 may have a layered structure of a barrier film, an aluminum-silicon (Al—Si) film, and a barrier film or a layered structure of a barrier film, an aluminum-silicon (Al—Si) film, a titanium nitride film, and a barrier film, for example. It is to be noted that the barrier film corresponds to a thin film formed from titanium, a nitride of titanium, molybdenum, or a nitride of molybdenum. Since aluminum and aluminum silicon have low resistance and are inexpensive, they are optimal materials for forming the conductive films 313. In addition, by providing barrier layers as an upper layer and a lower layer, hillock generation in aluminum or aluminum-silicon can be prevented. In addition, when a barrier film formed from titanium, which is an element having a high reducing property, is formed, even if there is a thin natural oxide film formed over a crystalline semiconductor film, the natural oxide film can be chemically reduced, and a favorable contact with the crystalline semiconductor film can be obtained.

Next, an insulating film 314 is formed so as to cover the conductive films 313. Over the insulating film 314, a conductive film 316 that is electrically connected to the conductive films 313 each of which forms a source or drain electrode of the thin film transistor 300a is formed. The conductive film 316 can be formed using any of the above-described materials of the conductive films 313.

Figure 11A:
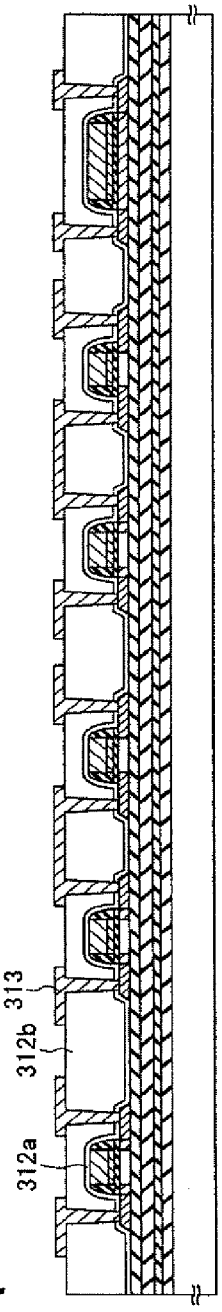
FIGS. 11A to 11C show an example of a method for manufacturing a semiconductor device of the present invention.
Figure 11B:
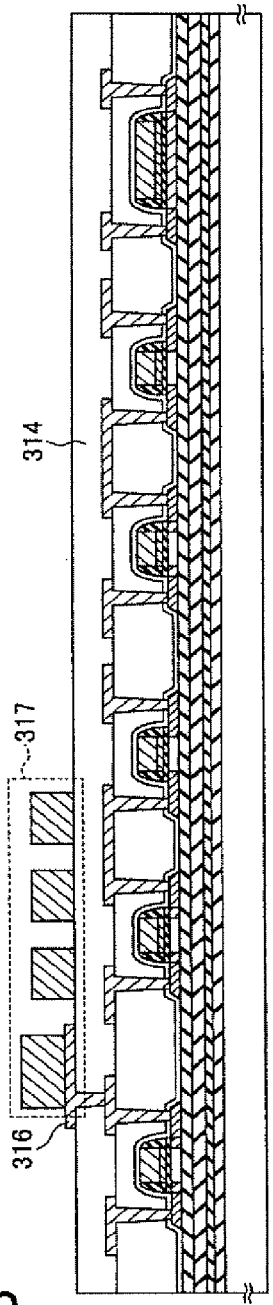
Figure 11C:
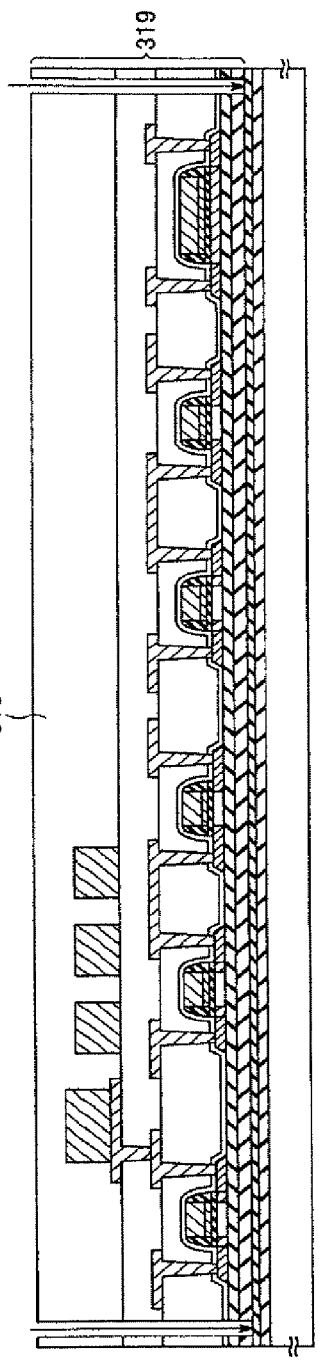

Subsequently, a conductive film 317 functioning as an antenna is formed so as to be electrically connected to the conductive film 316 (see FIG. 11B).

The insulating film 314 can be formed to have a single-layer or layered structure of an insulating film containing oxygen and/or nitrogen, such as silicon oxide, silicon nitride, silicon oxynitride, or silicon nitride oxide; a film containing carbon such as diamond-like carbon (DLC); an organic material such as an epoxy, a polyimide, a polyamide, polyvinylphenol, benzocyclobutene, or an acrylic; or a siloxane material such as a siloxane resin by a CVD method, a sputtering method, or the like.

The conductive film 317 is formed using a conductive material by a CVD method, a sputtering method, a printing method such as screen printing or gravure printing, a droplet discharging method, a dispenser method, a plating method, or the like. The conductive material is formed to have a single-layer or layered structure of an element selected from aluminum (Al), titanium (Ti), silver (Ag), copper (Cu), gold (Au), platinum (Pt), nickel (Ni), palladium (Pd), tantalum (Ta), and molybdenum (Mo); or an alloy or compound material containing any of the above elements as its main component.

For example, in the case of forming the conductive film functioning as an antenna by a screen printing method, the conductive film can be formed by selective printing of a conductive paste in which conductive particles each having a grain size of greater than or equal to several nm and less than or equal to several tens of µm are dissolved or dispersed in an organic resin. As the conductive particle, a metal particle of one or more metals of silver (Ag), gold (Au), copper (Cu), nickel (Ni), platinum (Pt), palladium (Pd), tantalum (Ta), molybdenum (Mo), titanium (Ti), and the like, a fine particle of silver halide, or a dispersive nanoparticle can be used. In addition, as the organic resin contained in the conductive paste, one or a plurality of organic resins each serving as a binder, a solvent, a dispersant, or a coating of the metal particle can be used. Typically, organic resins such as an epoxy resin and a silicone resin can be given as examples. In addition, for forming the conductive film, baking is preferably performed after the conductive paste is applied. For example, when fine particles (e.g., particles each having a grain size of greater than or equal to 1 nm and less than or equal to 100 nm) containing silver as its main component as a material of the conductive paste are used as a material for the conductive paste, the conductive paste is baked and hardened at temperatures in the range of greater than or equal to 150° C. and less than or equal to 300° C. to obtain the conductive film. Alternatively, fine particles containing solder or lead-free solder as its main component may be used. In this case, fine particles each having a grain size of less than or equal to 20 µm are preferably used. Solder or lead-free solder has an advantage such as low cost.

Next, after an insulating film 318 is formed so as to cover the conductive film 317, a layer including the thin film transistors 300a to 300e, the capacitor 300f, the conductive film 317, and the like (hereinafter, referred to as an "element formation layer 319") is separated from the substrate 301. In this embodiment mode, by laser beam irradiation (e.g., UV light), opening portions are formed in the element formation layer 319 excluding regions of the thin film transistors 300a to 300e and the capacitor 300f (see FIG. 11C). Then, the element formation layer 319 can be separated from the substrate 301. It is to be noted that by performing the separation of the element formation layer 319 while wetting the element formation layer 319 with liquid such as water, the thin film transistors provided in the element formation layer 319 can be prevented from being damaged by static electricity. Further, by reuse of the substrate 301 from which the element formation layer 319 has been separated, cost reduction can be achieved.

The insulating film 318 can be formed to have a single-layer or layered structure of an insulating film containing oxygen and/or nitrogen, such as silicon oxide, silicon nitride, silicon oxynitride, or silicon nitride oxide; a film containing carbon such as a diamond-like carbon (DLC); an organic material such as an epoxy, a polyimide, a polyamide, polyvinylphenol, benzocyclobutene, or an acrylic; or a siloxane material such as a siloxane resin by a CVD method, a sputtering method, or the like.

Figure 12A:
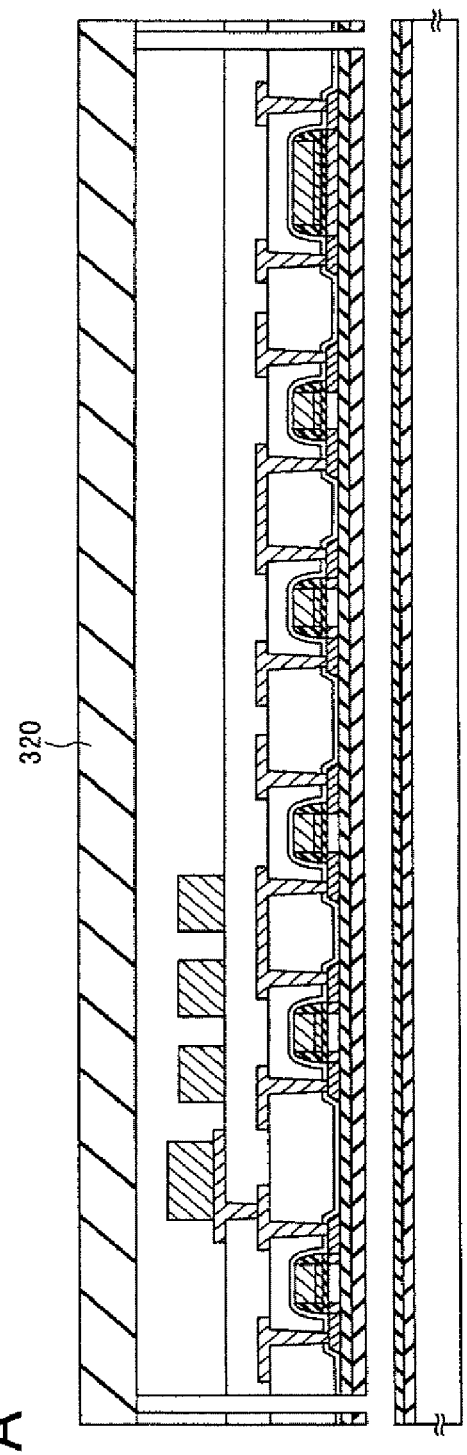
FIGS. 12A and 12B show an example of a method for manufacturing a semiconductor device of the present invention.

In this embodiment mode, after the opening portions are formed in the element formation layer 319 by laser beam irradiation, a first sheet material 320 is attached to one surface of the element formation layer 319 (a surface where the insulating film 318 is exposed), and then the element formation layer 319 is separated from the substrate 301 (see FIG. 12A).

Figure 12B:
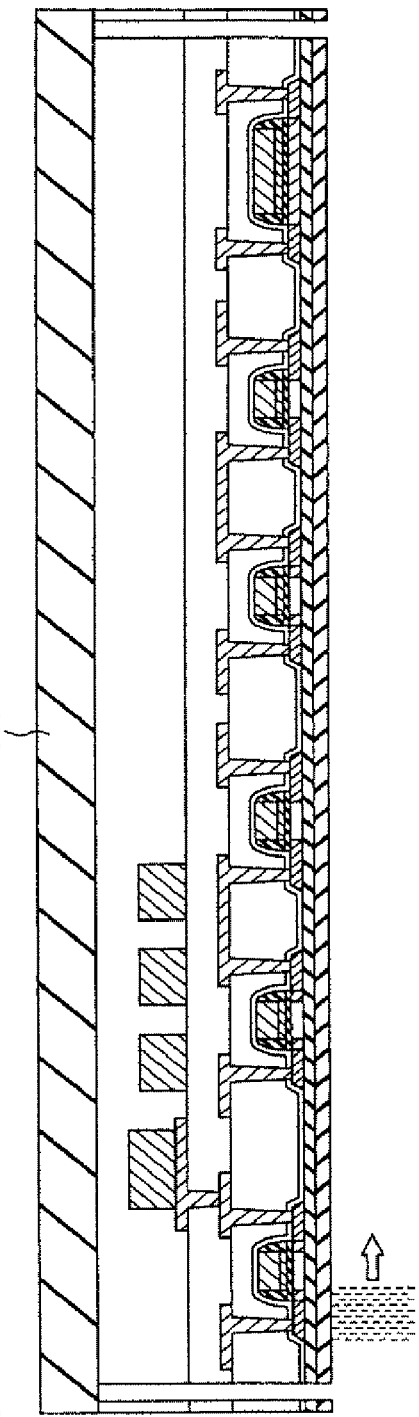

Next, the other surface of the element formation layer 319 (a surface exposed by the separation) is irradiated with a laser beam to perform laser annealing; thus the semiconductor films 305a to 305f are activated (see FIG. 12B). It is to be noted that heat treatment may be performed concurrently with the laser annealing.

In addition, prior to the laser annealing, for example, after a silicon nitride film is formed on the other surface of the element formation layer 319 which is exposed, the semiconductor films 305a to 305f may be subjected to dehydrogenation treatment by heat treatment in a nitrogen atmosphere. The dehydrogenation treatment can prevent change in crystalline state of the semiconductor film which is caused by bumping of hydrogen at the time of the laser beam irradiation. The semiconductor films 305a to 305f are subjected to the dehydrogenation treatment and then laser annealing, resulting in an improvement in crystalline state thereof. It is to be noted that although the laser annealing is performed in the step shown in FIG. 12B in this embodiment mode, the step of FIG. 12B is not necessarily needed and may be omitted.

Next, a photo resist film (not shown) is applied to the exposed surface of the insulating film 304, exposed to light, and developed, whereby a resist pattern is formed on the exposed surface of the insulating film 304. The insulating film 304 is etched using the resist pattern as a mask to form opening portions 304a to 304e located over the channel formation regions with the bottom gate insulating film 103 interposed therebetween and an opening portion 304f located in the capacitor. Each of regions of the bottom gate insulating film 103 which are exposed by the opening portions 304a to 304e has the same area as a region corresponding to the channel formation region, or is located within the region corresponding to the channel formation region. Subsequently, the resist pattern is removed.

Next, a conductive film is formed in the opening portions 304a to 304f and over the insulating film 304, and then selectively etched. Accordingly, the conductive films 322a to 322e remain over the channel formation regions with the bottom gate insulating film 103 interposed therebetween, and the conductive film 322f of the capacitor remains (see FIG. 13). Each of the conductive films 322a to 322e can function as a bottom gate electrode. In addition, the conductive film 322f can function as an electrode of the capacitor. It is preferred that each of the conductive films 322a to 322e which functions as a bottom gate electrode be of the same or smaller size than the channel formation region and be located within the channel formation region.

For the conductive film, it is possible to use, for example, a film formed from an element selected from tantalum (Ta), tungsten (W), titanium (Ti), molybdenum (Mo), aluminum (Al), copper (Cu), chromium (Cr), niobium (Nb), and the like; a film formed from a nitride of any of the above elements (typically, a tantalum nitride film, a tungsten nitride film, or a titanium nitride film); an alloy film in which the above elements are combined (typically, a Mo—W alloy or a Mo—Ta alloy); or a silicide film of any of the above elements (typically, a tungsten silicide film, a titanium silicide film, or a nickel silicide film). The conductive film may have a structure in which a plurality of conductive films is stacked. For example, a tantalum nitride film with a thickness of greater than or equal to 20 nm and less than or equal to 100 nm and a tungsten film with a thickness of greater than or equal to 100 nm and less than or equal to 400 nm can be stacked in this order. Tungsten and tantalum nitride have high heat resistance, and thus can be subjected to heat treatment for the purpose of heat activation after formation of the conductive film. Accordingly, dual-gate TFTs can be formed.

Figure 13:
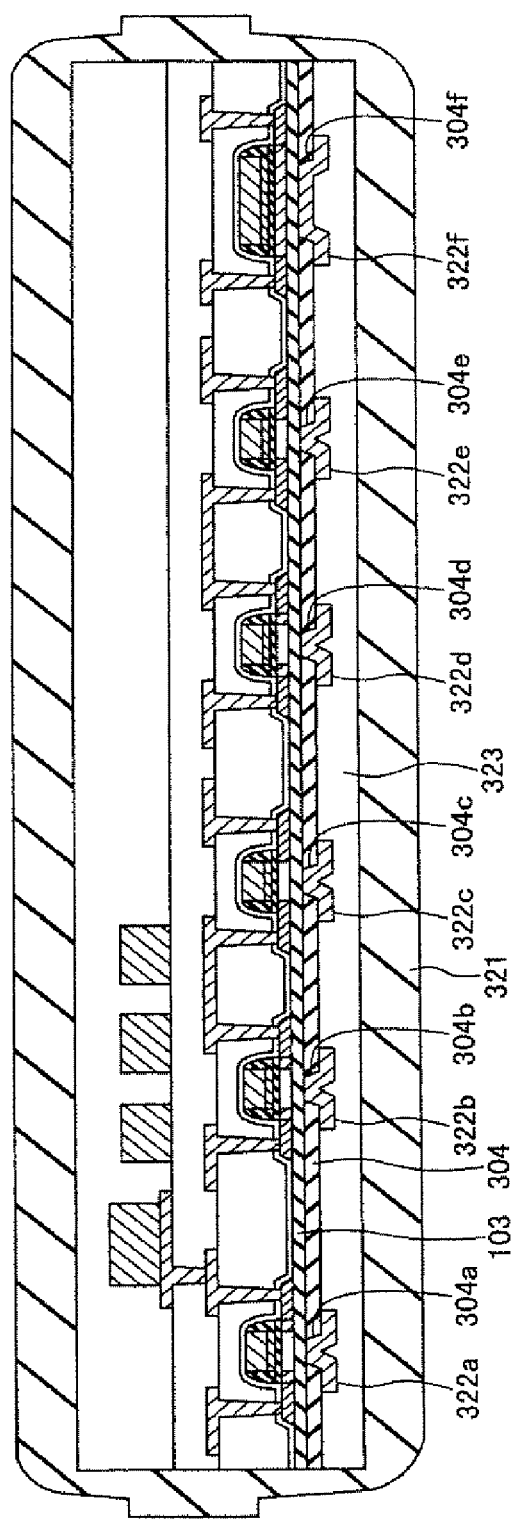
FIG. 13 shows an example of a method for manufacturing a semiconductor device of the present invention.
Figure 14:
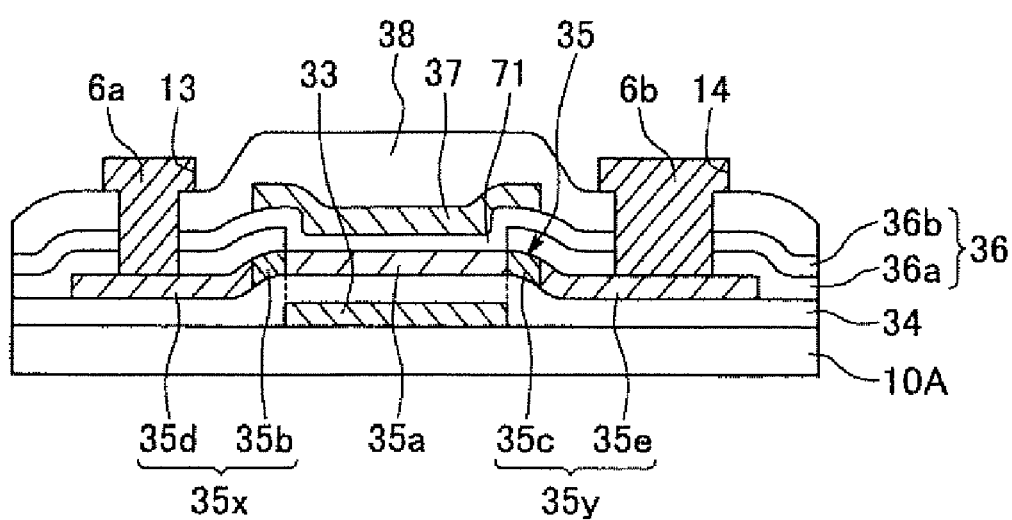
FIG. 14 is a cross-sectional view showing a conventional dual-gate TFT.
Figure 15A:
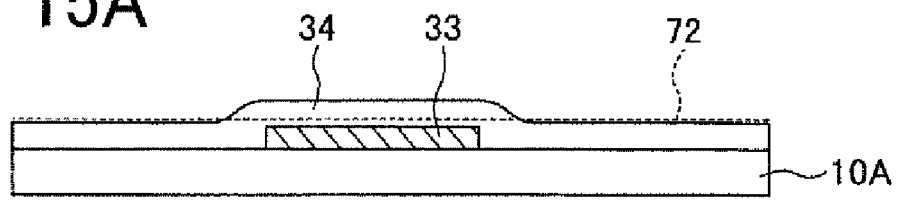
FIGS. 15A and 15B are cross-sectional views showing a method for forming a semiconductor film included in a dual-gate TFT shown in FIG. 14.
Figure 15B:
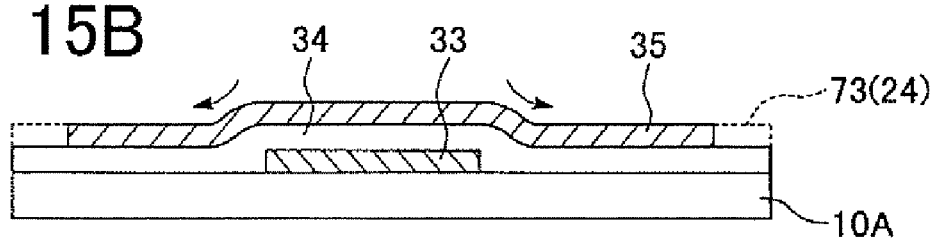

Next, an insulating film 323 is formed so as to cover the conductive films 322a to 322f (see FIG. 13).

The insulating film 323 can be formed to have a single-layer or layered structure of an insulating film containing oxygen and/or nitrogen, such as silicon oxide, silicon nitride, silicon oxynitride, or silicon nitride oxide; a film containing carbon such as a diamond-like carbon (DLC); an organic material such as an epoxy, a polyimide, a polyamide, polyvinylphenol, benzocyclobutene, or an acrylic; or a siloxane material such as a siloxane resin by a CVD method, a sputtering method, or the like.

A second sheet material 321 is attached to the insulating film 323, followed by one or both of heat treatment and pressurization treatment for attachment of the second sheet material 321 (see FIG. 13). The first sheet material 320 and the second sheet material 321 may be a hot-melt film or the like.

Alternatively, for the first sheet material 320 and the second sheet material 321, a film that has been subjected to antistatic treatment for preventing static electricity or the like (hereinafter referred to as an antistatic film) can also be used. As the antistatic film, a film in which an antistatic material is dispersed in a resin, a film to which an antistatic material is attached, and the like are given as examples. The film provided with an antistatic material may be a film with an antistatic material provided on one of its surfaces or a film with an antistatic material provided on each surface. Further, the film with an antistatic material provided on one of its surfaces may be attached to the layer so that the antistatic material is placed on the inner side of the film or the outer side of the film. The antistatic material may be provided over the entire surface of the film or over a part of the film. As the antistatic material, a metal, indium tin oxide (ITO), or a surfactant such as an amphoteric surfactant, a cationic surfactant, or a nonionic surfactant can be used. Further, as the antistatic material, a resin material that contains a cross-linked copolymer having a carboxyl group and a quaternary ammonium base on its side chain, or the like can be used. Such a material is attached, mixed, or applied to a film, whereby an antistatic film can be formed. By sealing using the antistatic film, the semiconductor elements can be protected from adverse effects such as external static electricity when dealt with as a commercial product.

It is to be noted that, a variety of modes can be employed for the structure of the semiconductor device described in this embodiment mode. That is, although a structure almost similar to that of the semiconductor device shown in FIG. 3A is employed in this embodiment mode, there is no limitation to this structure; a semiconductor device having any other structure may be adopted. For example, a structure similar to that of the semiconductor device shown in FIG. 3B or the structure of any of the semiconductor devices of Embodiment Modes 2 to 5 may be adopted.

It is to be noted that the present invention is not limited to the aforementioned embodiment modes, and a variety of modifications are possible without departing from the spirit and scope of the present invention. For example, any of the aforementioned embodiment modes may be combined with each other.

This application is based on Japanese Patent Application serial no. 2007-185597 filed with Japan Patent Office on Jul. 17, 2007, the entire contents of which are hereby incorporated by reference.

What is claimed is:

1. A method for manufacturing a semiconductor device, comprising steps of:
    forming a separation layer over a substrate;
    forming an insulating film over the separation layer;
    forming a bottom gate insulating film over the insulating film;
    forming an amorphous semiconductor film over the bottom gate insulating film over the bottom gate insulating film;
    crystallizing the amorphous semiconductor film to form a crystalline semiconductor film over the bottom gate insulating film;
    forming a top gate insulating film over the crystalline semiconductor film;
    forming a top gate electrode over the top gate insulating film;
    separating the separation layer from the insulating film;
    forming an opening portion in the insulating film to expose a portion of the bottom gate insulating film; and
    forming a bottom gate electrode in contact with the portion of the bottom gate insulating film.

2. The method for manufacturing a semiconductor device, according to claim 1,
    wherein the crystalline semiconductor film includes a channel formation region, and
    wherein a contact region between the bottom gate electrode and the bottom gate insulating film is located within a region corresponding to the channel formation region.

3. The method for manufacturing a semiconductor device, according to claim 1,
    wherein the crystalline semiconductor film includes a channel formation region and low concentration impurity regions formed outward from the channel formation region, and
    wherein a contact region between the bottom gate electrode and the bottom gate insulating film is located within a region corresponding to the channel formation region and the low concentration impurity regions.

4. A method for manufacturing a semiconductor device, comprising steps of:
    forming a separation layer over a substrate;
    forming an insulating film over the separation layer;
    forming an amorphous semiconductor film over the insulating film;
    crystallizing the amorphous semiconductor film to form a crystalline semiconductor film over the insulating film;
    forming a top gate insulating film over the crystalline semiconductor film;
    forming a top gate electrode over the top gate insulating film;
    separating the separation layer from the insulating film;
    forming an opening portion in the insulating film to expose a portion of the crystalline semiconductor film;
    forming a bottom gate insulating film in contact with the portion of the crystalline semiconductor film; and
    forming a bottom gate electrode in contact with the bottom gate insulating film.

5. The method for manufacturing a semiconductor device, according to claim 4,
    wherein the crystalline semiconductor film includes a channel formation region, and
    wherein a region of the crystalline semiconductor film exposed by the opening portion is located within a region corresponding to the channel formation region.

6. The method for manufacturing a semiconductor device, according to claim 4,
wherein the crystalline semiconductor film includes a channel formation region and low concentration impurity regions formed outward from the channel formation region, and
wherein a region of the crystalline semiconductor film exposed by the opening portion is located within a region corresponding to the channel formation region and the low concentration impurity regions.

7. A method for manufacturing a semiconductor device, comprising steps of:
forming a separation layer over a substrate;
forming an insulating film over the separation layer;
forming an amorphous semiconductor film over the insulating film;
crystallizing the amorphous semiconductor film to form a crystalline semiconductor film over the insulating film;
forming a top gate insulating film over the crystalline semiconductor film;
forming a top gate electrode over the top gate insulating film;
separating the separation layer from the insulating film;
forming an opening portion in the insulating film to expose a portion of the crystalline semiconductor film;
processing the portion of the crystalline semiconductor film to form a thin film region in which the crystalline semiconductor film is thinned in the crystalline semiconductor film;
forming a bottom gate insulating film in contact with the thin film region; and
forming a bottom gate electrode in contact with the bottom gate insulating film.

8. The method for manufacturing a semiconductor device, according to claim 7,
wherein the crystalline semiconductor film includes a channel formation region, and
wherein the thin film region is located within a region corresponding to the channel formation region.

* * * * *